US012272769B2

(12) United States Patent
Lee et al.

(10) Patent No.: US 12,272,769 B2
(45) Date of Patent: Apr. 8, 2025

(54) DISPLAY DEVICE AND METHOD OF MANUFACTURING THE SAME

(71) Applicant: SAMSUNG DISPLAY CO., LTD., Yongin-si (KR)

(72) Inventors: Hyun Wook Lee, Yongin-si (KR); Hyun Kim, Yongin-si (KR); Jeong Su Park, Yongin-si (KR); Jong Chan Lee, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 469 days.

(21) Appl. No.: 17/579,331

(22) Filed: Jan. 19, 2022

(65) Prior Publication Data
US 2022/0336709 A1 Oct. 20, 2022

(30) Foreign Application Priority Data

Apr. 15, 2021 (KR) .................. 10-2021-0049411

(51) Int. Cl.
| H01L 33/38 | (2010.01) |
| H01L 27/15 | (2006.01) |
| H01L 33/00 | (2010.01) |
| H01L 33/42 | (2010.01) |
| H01L 33/62 | (2010.01) |

(52) U.S. Cl.
CPC .......... *H01L 33/382* (2013.01); *H01L 27/156* (2013.01); *H01L 33/005* (2013.01); *H01L 33/42* (2013.01); *H01L 33/62* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS

| 10,943,947 | B2 | 3/2021 | Im et al. | |
| 2007/0152537 | A1* | 7/2007 | Yamaguchi | ............. G01L 17/00 310/311 |
| 2016/0240561 | A1 | 8/2016 | Saito et al. | |
| 2018/0175009 | A1* | 6/2018 | Kim | .................... H01L 25/0753 |
| 2018/0175106 | A1* | 6/2018 | Kim | .................... H01L 25/0753 |
| 2019/0326348 | A1* | 10/2019 | Im | ......................... H01L 27/156 |

(Continued)

FOREIGN PATENT DOCUMENTS

| KR | 10-2019-0121894 A | 10/2019 |
| KR | 10-2020-0006209 | 1/2020 |
| KR | 10-2020-0118315 A | 10/2020 |

*Primary Examiner* — Nishath Yasmeen
(74) *Attorney, Agent, or Firm* — Womble Bond Dickinson (US) LLP

(57) ABSTRACT

A display device and a method of manufacturing the same are provided. The display device includes a pixel including an emission area and a non-emission area, a transistor of the pixel, a protective layer on the transistor, and including an opening area overlapping the non-emission area, alignment electrodes on the protective layer and spaced apart from each other, light emitting elements between respective ones of the alignment electrodes in the emission area, and a connection electrode electrically connected to the light emitting elements, and electrically connected to the transistor in the opening area.

10 Claims, 16 Drawing Sheets

(56) References Cited

U.S. PATENT DOCUMENTS

| | | | |
|---|---|---|---|
| 2019/0393356 A1* | 12/2019 | Le | .................... H01L 29/78603 |
| 2020/0168661 A1 | 5/2020 | Xue | |
| 2020/0258938 A1* | 8/2020 | Chai | .................. H01L 27/1255 |
| 2020/0321427 A1 | 10/2020 | Park et al. | |
| 2021/0305222 A1* | 9/2021 | Min | ..................... H01L 25/167 |

\* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2021-0049411, filed on Apr. 15, 2021, in the Korean Intellectual Property Office, the content of which in its entirety is herein incorporated by reference.

BACKGROUND

1. Field

The disclosure relates to a display device and a method of manufacturing the same.

2. Description of the Related Art

As interest in an information display is increasing, research and development for a display device are being continuously conducted.

SUMMARY

The present disclosure provides a display device, and a method of manufacturing the same for reducing or minimizing a defect due to a contact resistance and reactivity of electrodes.

The present disclosure is not limited to the above, and other technical aspects that are not described will be clearly understood by those skilled in the art from the following description.

A display device according to some embodiments includes a pixel including an emission area and a non-emission area, a transistor of the pixel, a protective layer on the transistor, and including an opening area overlapping the non-emission area, alignment electrodes on the protective layer and spaced apart from each other, light emitting elements between respective ones of the alignment electrodes in the emission area, and a connection electrode electrically connected to the light emitting elements, and electrically connected to the transistor in the opening area.

The transistor may include a source electrode or a drain electrode, and
  wherein the connection electrode is electrically connected to the source electrode or the drain electrode.

The connection electrode may contact the source electrode or the drain electrode through a contact hole in the opening area.

The contact hole may pass through one or more of the alignment electrodes.

The display device may further include an insulating layer between the alignment electrodes and the connection electrode, wherein the contact hole passes through the insulating layer.

The display device may further include a pad in the opening area.

The pad may include a pad line, and a pad electrode on the pad line.

The pad line may be at a same layer as the source electrode or the drain electrode.

The pad electrode may be at a same layer as the connection electrode.

The source electrode or the drain electrode may include a first electrode layer including titanium (Ti), and a second electrode layer on the first electrode layer and including copper (Cu).

The source electrode or the drain electrode may further include a third electrode layer including titanium (Ti) on the second electrode layer, and a fourth electrode layer including indium tin oxide (ITO) on the third electrode layer.

A method of manufacturing a display device according to some embodiments includes forming a transistor on a substrate including an emission area and a non-emission area, forming a protective layer on the transistor, forming an opening area overlapping the non-emission area by etching the protective layer, forming alignment electrodes spaced apart from each other on the protective layer, providing light emitting elements between respective ones of the alignment electrodes, and forming a connection electrode on the light emitting elements, and electrically connected to the transistor through the opening area.

In forming the protective layer, the protective layer at the opening area may have a first thickness, and the protective layer at the emission area has a second thickness that is thicker than the first thickness.

The transistor may include a source electrode or a drain electrode, wherein the source electrode or the drain electrode is exposed by the opening area of the protective layer.

The method may further include forming a contact hole by removing the alignment electrodes of the opening area.

The connection electrode may contact the source electrode or the drain electrode through the contact hole.

The source electrode or the drain electrode may be formed by sequentially stacking first to fourth electrode layers.

The method may further include removing a portion of the third and fourth electrode layers, wherein the third electrode layer includes titanium (Ti), and wherein the fourth electrode layer includes copper (Cu).

The connection electrode may contact the second electrode layer through the contact hole.

The third electrode layer may include titanium (Ti), wherein the fourth electrode layer includes indium tin oxide (ITO), and wherein the connection electrode contacts the fourth electrode layer through the contact hole.

Details of other embodiments are included in the detailed description and drawings.

According to some embodiments of the disclosure, the connection electrodes and the pad electrode may be directly connected to a circuit element located under the connection electrodes and the pad electrode through the opening area in which the protective layer is partially removed. Accordingly, because the alignment electrodes may be separated from the connection electrodes and/or the circuit element, a contact resistance of the alignment electrodes and the connection electrodes may be reduced or minimized, and a defect due to reactivity between the alignment electrodes and conductive layer configuring the circuit element may be reduced or minimized.

Aspects embodiments are not limited by the contents illustrated above, and other various aspects are included in the present specification.

BRIEF DESCRIPTION OF THE DRAWINGS

The above and other aspects of the disclosure will become more apparent by describing in further detail embodiments thereof with reference to the accompanying drawings, in which.

DETAILED DESCRIPTION

Figure 1:
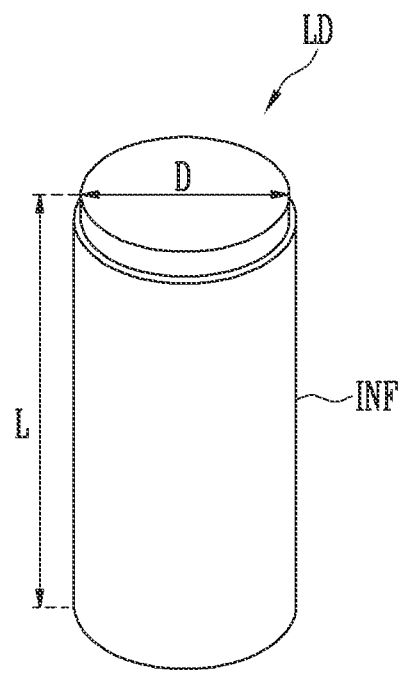
FIGS. 1 and 2 are perspective and cross-sectional views illustrating a light emitting element according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
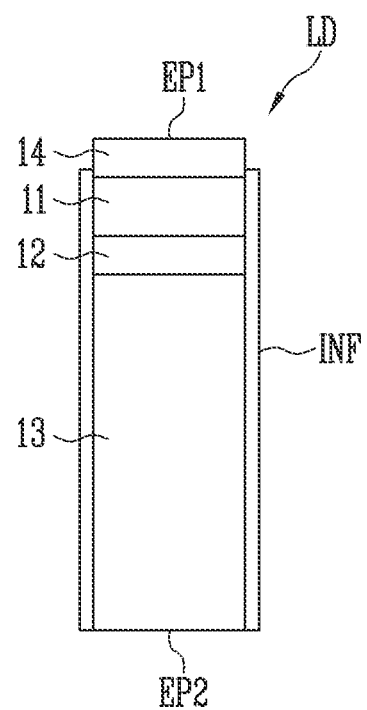

FIGS. 1 and 2 are perspective and cross-sectional views illustrating a light emitting element according to some embodiments. FIGS. 1 and 2 show a column-shaped light emitting element LD, but a type and/or a shape of the light emitting element LD are/is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending along one direction. The light emitting element LD may have a first end portion EP1 and a second end portion EP2. One of the first and second semiconductor layers 11 and 13 may be located at the first end portion EP1 of the light emitting element LD. The other of the first and second semiconductor layers 11 and 13 may be located at the second end portion EP2 of the light emitting element LD. For example, the first semiconductor layer 11 may be located at the first end portion EP1 of the light emitting element LD, and the second semiconductor layer 13 may be located at the second end portion EP2 of the light emitting element LD.

According to some embodiments, the light emitting element LD may be a light emitting element manufactured in a column shape through an etching method or the like. In the present specification, the column shape includes a rod-like shape or a bar-like shape of an aspect ratio that is greater than 1, such as a circular column or a polygonal column, and the shape of the cross-section thereof is not limited.

The light emitting element LD may have a size that is as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, AlN, and InN, and may include a p-type semiconductor layer doped with a first conductivity type dopant, such as Mg. However, the material configuring the first semiconductor layer 11 is not limited thereto, and various other materials may configure the first semiconductor layer 11.

The active layer 12 may be located between the first semiconductor layer 11 and the second semiconductor layer 13, and may be formed in a single-quantum well or multi-quantum well structure. A position of the active layer 12 may be variously changed according to the type of the light emitting element LD. According to some embodiments, a material of AlGaN, InAlGaN, or the like may be used to form the active layer 12, and various other materials may configure the active layer 12. In some embodiments, a clad layer doped with a conductive dopant may be formed on and/or under the active layer 12. For example, the clad layer may be formed of AlGaN or InAlGaN.

The second semiconductor layer 13 may be located on the active layer 12, and may include a semiconductor layer that is of a type that is different from that of the first semiconductor layer 11. The second semiconductor layer 13 may include an n-type semiconductor layer. For example, the second semiconductor layer 13 may include any one semiconductor material among InAlGaN, GaN, AlGaN, InGaN, AlN, and InN, and may include an n-type semiconductor layer doped with a second conductivity type dopant such as Si, Ge, and Sn. However, the material configuring the second semiconductor layer 13 is not limited thereto, and the second semiconductor layer 13 may be formed of various other materials.

When a voltage that is equal to, or greater than, a threshold voltage is applied to both ends of the light emitting element LD, an electron-hole pair is combined in the active layer 12, and thus the light emitting element LD emits light. By controlling emission of the light emitting element LD using such a principle, the light emitting element LD may be used as a light source of various light emitting devices including a pixel of a display device.

The electrode layer 14 may be located on the first end portion EP1 and/or the second end portion EP2 of the light emitting element LD. FIG. 2 illustrates a case in which the electrode layer 14 is formed on the first semiconductor layer 11, but is not limited thereto. For example, a separate contact electrode may be further located on the second semiconductor layer 13.

The electrode layer 14 may include a transparent metal or a transparent metal oxide. For example, the electrode layer 14 may include at least one of indium tin oxide (ITO), indium zinc oxide (IZO), zinc oxide (ZnO), and zinc tin oxide (ZTO), but is not limited thereto. As described above, when the electrode layer 14 is formed of the transparent metal or the transparent metal oxide, light generated in the active layer 12 of the light emitting element LD may pass through the electrode layer 14, and may be emitted to the outside of the light emitting element LD.

The light emitting element LD may further include an insulating film INF formed on a surface. The insulating film INF may be directly located on the surface of the first semiconductor layer 11, the active layer 12, the second semiconductor layer 13, and/or the electrode layer 14. The insulating film INF may expose the first and second end portions EP1 and EP2 of the light emitting element LD having different polarities. According to some embodiments, the insulating film INF may expose a side portion of the electrode layer 14 and/or the second semiconductor layer 13 adjacent to the first and second end portions EP1 and EP2 of the light emitting element LD.

The insulating film INF may include at least one of aluminum oxide (AlOx), aluminum nitride (AlNx), silicon oxide (SiOx), silicon nitride (SiNx), silicon oxynitride (SiOxNy), zirconium oxide (ZrOx), hafnium oxide (HfOx), and/or titanium oxide (TiOx). For example, the insulating film INF may be configured of a double layer, and each layer configuring the double layer may include different (e.g., respective) materials. In this case, each layer configuring the double layer of the insulating film INF may be formed by different processes. In some embodiments, the insulating film INF may be configured of a double layer formed of aluminum oxide (AlOx) and silicon oxide (SiOx), but is not limited thereto. According to some embodiments, the insulating film INF may be omitted.

When the insulating film INF is provided on the surface of the light emitting element LD, the likelihood of short-circuiting of the active layer 12 with at least one electrode (for example, at least one of electrodes connected to both ends of the light emitting element LD), or the like, may be reduced or prevented. Accordingly, electrical stability of the light emitting element LD may be secured. In addition, life and efficiency may be improved by reducing or minimizing a surface defect of the light emitting element LD.

A light emitting device including the light emitting element LD described above may be used in various types of devices that require a light source, including a display device. For example, a plurality of light emitting elements LD may be located in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
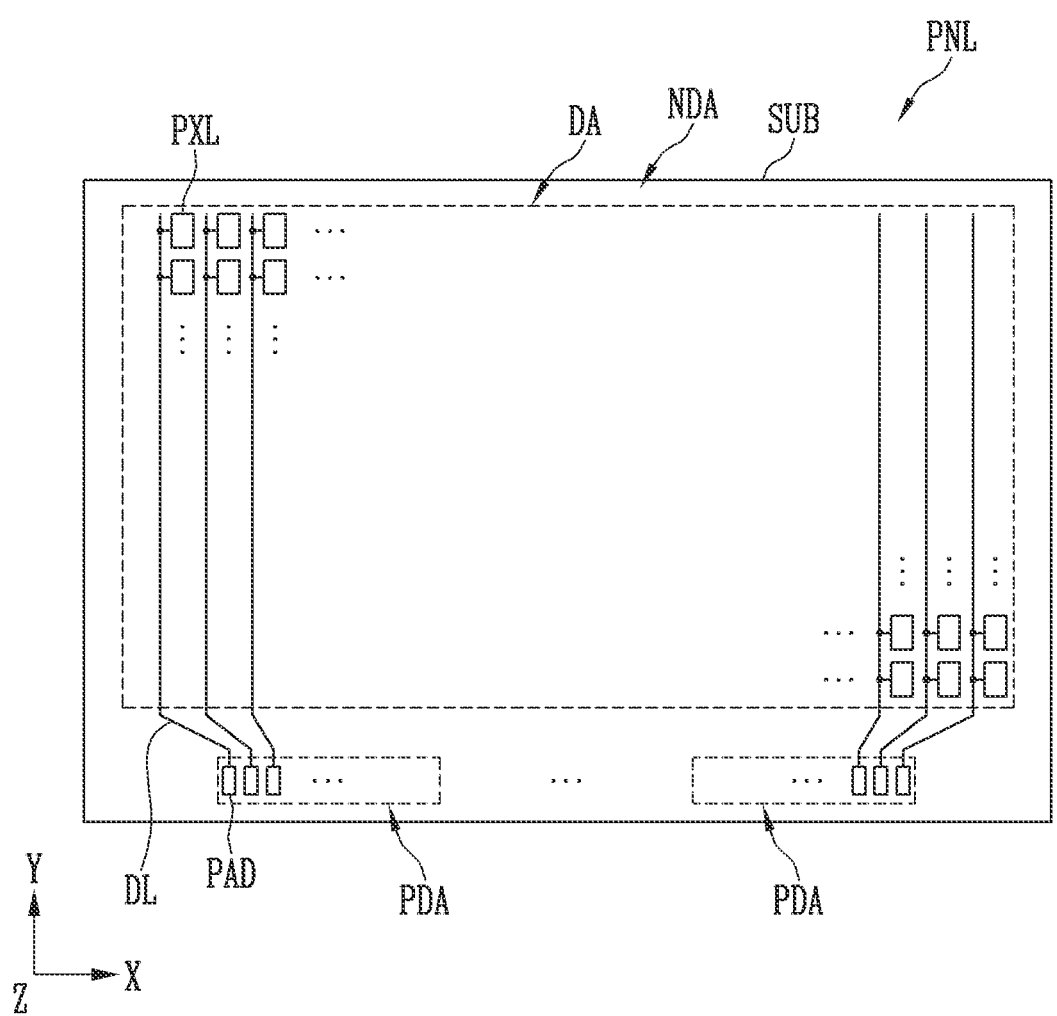
FIG. 3 is a plan view illustrating a display device according to some embodiments.

FIG. 3 is a plan view illustrating a display device according to some embodiments.

In FIG. 3, as an example of an electronic device that may use the light emitting element LD described in the embodiments of FIGS. 1 and 2 as a light source, a display device, for example, a display panel PNL provided in the display device is shown.

Each pixel unit of the display panel PNL may include at least one light emitting element LD. For convenience of description, in FIG. 3, a structure of the display panel PNL is briefly shown based on a display area DA. However, according to some embodiments, at least one driving circuit unit (for example, at least one of a scan driver and a data driver), lines, and/or pads, which are/is not shown, may be further located on the display panel PNL.

Referring to FIG. 3, the display panel PNL may include a substrate SUB and a pixel PXL located on the substrate SUB. The display panel PNL and the substrate SUB for forming the same may include a display area DA for displaying an image and a non-display area NDA except for the display area DA. The display area DA may configure a screen on which the image is displayed, and the non-display area NDA may be an area except for the display area DA.

The pixels PXL may be located in the display area DA on the substrate SUB. For example, the display area DA may include a plurality of pixel areas in which each pixel PXL is located.

The non-display area NDA may be located around the display area DA. The non-display area NDA may include a pad area PDA, and pads PAD may be located in the pad area PDA. For example, the pads PAD may be connected to a driving circuit such as a source driver and a timing controller mounted on a flexible circuit board. When the display panel PNL is connected to a plurality of source drivers, the pad areas PDA may correspond to the source drivers, respectively.

The pixel PXL may be connected to the pad PAD through a data line DL, and may receive a data signal from the source driver. When an embedded circuit unit (for example, a gate driver) is provided in the display panel PNL, the embedded circuit unit may be connected to the pad PAD. In FIG. 3, the pad PAD (or the pad area PDA) is located only on a lower side of the display panel PNL, but is not limited thereto. For example, the pads PAD may be located on an upper side and a lower side of the display panel PNL, respectively.

According to some embodiments, at least two types of pixels PXL for emitting light of different colors may be located in the display area DA. Each pixel unit configured of the pixels PXL of different colors located adjacent to each other may express various colors.

In some embodiments, each pixel PXL may be set as a pixel of a color (e.g., a predetermined color), and may include light emitting element LD that generates light of the color (e.g., the predetermined color). In other embodiments, at least some of the pixels PXL may include a light emitting element LD that generates light of a first color, and a light conversion layer, which converts the light of the first color into light of a second color, may be located in an upper portion of the pixel PXL. Accordingly, the light of the second color may be generated by using the at least some of the pixels PXL.

The pixel PXL may include at least one light source driven by a control signal (e.g., a predetermined control signal) (for example, a scan signal and a data signal) and/or power (e.g., predetermined power such as, for example, first power and second power). In some embodiments, the light source may include at least one light emitting element LD according to any of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

In addition, the pixel PXL may have a structure according to at least one of the embodiments to be described below. For example, each pixel PXL may have a structure to which one or more of the embodiments to be described later is applied, or a structure to which at least two embodiments are applied in combination.

In some embodiments, the pixel PXL may be configured as an active pixel, but is not limited thereto. For example, the pixel PXL may be configured as a pixel of a passive or active light emitting display device of various structures and/or driving methods.

Figure 4:
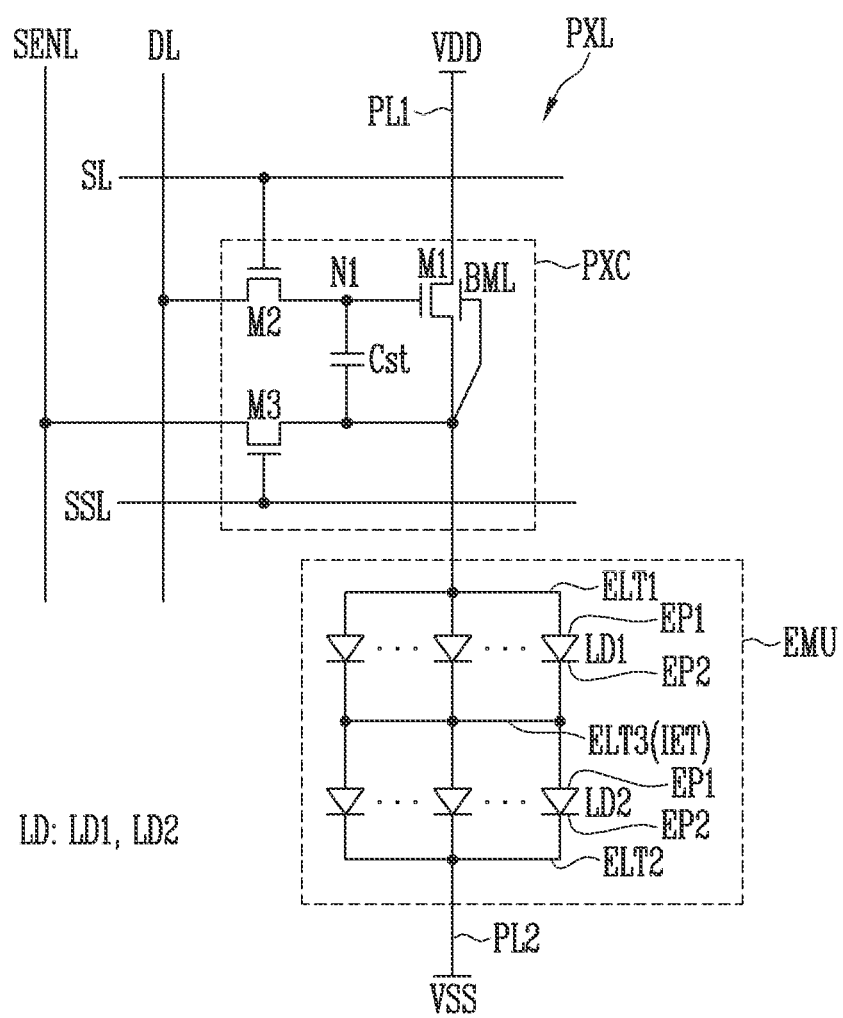
FIG. 4 is a circuit diagram illustrating a pixel according to some embodiments.

FIG. 4 is a circuit diagram illustrating a pixel according to some embodiments.

Referring to FIG. 4, each pixel PXL may further include a light emitting unit EMU for generating light of a luminance corresponding to a data signal, and a pixel circuit PXC for driving the light emitting unit EMU.

The pixel circuit PXC may be connected between first power VDD and the light emitting unit EMU. In addition, the pixel circuit PXC may be connected to a scan line SL and to a data line DL of the corresponding pixel PXL, and may control an operation of the light emitting unit EMU in response to a scan signal and a data signal supplied from the scan line SL and the data line DL, respectively. In addition, the pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power VDD and a first connection electrode ELT1. A gate electrode of the first transistor M1 may be connected to a first node N1. The first transistor M1 may control a driving current supplied to the light emitting unit EMU in response to a voltage of the first node N1. That is, the first transistor M1 may be a driving transistor that controls the driving current of the pixel PXL.

In some embodiments, the first transistor M1 may selectively include a bottom metal layer BML (also referred to as a "lower electrode," a "back gate electrode," or a "lower light blocking layer"). The gate electrode of the first transistor M1 and the lower metal layer BML may overlap each other with an insulating layer interposed therebetween. In some embodiments, the lower metal layer BML may be connected to one electrode of the first transistor M1, for example, to a source electrode or to a drain electrode.

In a case where the first transistor M1 includes the lower metal layer BML, when driving the pixel PXL, a back-biasing technology (or sync technology) of moving a threshold voltage of the first transistor M1 in a negative direction or a positive direction by applying a back-biasing voltage to the lower metal layer BML of the first transistor M1 may be applied. For example, the threshold voltage of the first transistor M1 may move in the negative direction or in the positive direction by applying a source-sync technology by connecting the lower metal layer BML to the source electrode of the first transistor M1. In addition, when the lower metal layer BML is located under a semiconductor pattern configuring a channel of the first transistor M1, the lower metal layer BML may serve as a light blocking pattern and stabilize an operation characteristic of the first transistor M1. However, a function and/or a utilization method of the lower metal layer BML are/is not limited thereto.

The second transistor M2 may be connected between the data line DL and the first node N1. In addition, a gate electrode of the second transistor M2 may be connected to the scan line SL. The second transistor M2 may be turned on when a scan signal of a gate-on voltage (for example, a high level voltage) is supplied from the scan line SL to thereby electrically connect the data line DL and the first node N1.

For each frame period, a data signal of a corresponding frame may be supplied to the data line DL, and the data signal may be transmitted to the first node N1 through the turned on second transistor M2 during a period in which the scan signal of the gate-on voltage is supplied. That is, the second transistor M2 may be a switching transistor for transmitting each data signal to the inside of the pixel PXL.

One electrode of the storage capacitor Cst may be connected to the first node N1, and another electrode may be connected to the second electrode of the first transistor M1.

The storage capacitor Cst may charge a voltage corresponding to the data signal supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value applied to the first connection electrode ELT1 to the sensing line SENL according to a sensing signal supplied to the sensing signal line SSL. The voltage value transmitted through the sensing line SENL may be provided to an external circuit (for example, a timing controller), and the external circuit may extract characteristic information (for example, the threshold voltage or the like of the first transistor M1) of each pixel PXL based on the provided voltage value. The extracted characteristic information may be used to convert image data so that a characteristic deviation between the pixels PXL is compensated.

Meanwhile, in FIG. 4, all transistors included in the pixel circuit PXC are n-type transistors, but are not limited thereto. For example, at least one of the first to third transistors M1, M2, and M3 may be changed to a p-type transistor.

In addition, a structure and a driving method of the pixel PXL may be variously changed. For example, the pixel circuit PXC may be configured of a pixel circuit of various structures and/or driving methods, in addition to the embodiments of FIG. 4.

For example, the pixel circuit PXC may omit the third transistor M3 in other embodiments. In addition, the pixel circuit PXC may additionally include at least one or more other circuit elements, such as a compensation transistor for compensating for the threshold voltage or the like of the first transistor M1, an initialization transistor for initializing the voltage of the first node N1 and/or the first electrode ELT1, an emission control transistor for controlling a period in which the driving current is supplied to the light emitting unit EMU, and/or a boosting capacitor for boosting the voltage of the first node N1.

The light emitting unit EMU may include the light emitting elements LD connected between the first power VDD and second power VSS.

For example, the light emitting unit EMU may include the first connection electrode ELT1 (or also referred to as a "first electrode") connected to the first power VDD through the pixel circuit PXC and a first power line PL1, a second connection electrode ELT2 (or also referred to as a "second electrode") connected to the second power VSS through a second power line PL2, and the plurality of light emitting elements LD connected between the first and second connection electrodes ELT1 and ELT2.

The first power VDD and the second power VSS may have different potentials so that the light emitting elements LD may emit light. For example, the first power VDD may be set as a high potential power, and the second power VSS may be set as a low potential power.

In some embodiments, the light emitting unit EMU may include at least one series stage. Each series stage may include a pair of electrodes (for example, two electrodes) and at least one light emitting element LD connected in a forward direction between the pair of electrodes. Here, the number of series stages configuring the light emitting unit EMU, and the number of light emitting elements LD configuring each series stage, are not particularly limited. For example, the number of light emitting elements LD configuring each series stage may be the same as, or different from, each other, and the number of the light emitting elements LD is not particularly limited.

Referring to FIG. 4, the light emitting unit EMU may include a first series stage including at least one first light emitting element LD1, and a second series stage including at least one second light emitting element LD2.

The first series stage may include the first connection electrode ELT1, a third connection electrode ELT3, and at least one first light emitting element LD1 connected between the first and third connection electrodes ELT1 and ELT3. Each first light emitting element LD1 may be connected in a forward direction between the first and third connection electrodes ELT1 and ELT3. For example, the first end portion EP1 of the first light emitting element LD1 may be connected to the first connection electrode ELT1, and the second end portion EP2 of the first light emitting element LD1 may be connected to the third connection electrode ELT3. The third connection electrode ELT3 may configure an intermediate electrode IET connecting the first series stage and the second series stage.

The second series stage may include the third connection electrode ELT3, the second connection electrode ELT2, and at least one second light emitting element LD2 connected between the second and third connection electrodes ELT2 and ELT3. Each second light emitting element LD2 may be connected in the forward direction between the second and third connection electrodes ELT2 and ELT3. For example, the first end portion EP1 of the second light emitting element LD2 may be connected to the third connection electrode ELT3, and the second end portion EP2 of the second light emitting element LD2 may be connected to the second connection electrode ELT2.

Meanwhile, the number of series stages configuring each light emitting unit EMU may be variously changed according to some embodiments. For example, the light emitting unit EMU may include the plurality of light emitting elements LD divided and connected to four or more series stages.

A first electrode of the light emitting unit EMU, for example, the first connection electrode ELT1 may be an anode electrode of the light emitting unit EMU. A last electrode of the light emitting unit EMU, for example, the second connection electrode ELT2, may be a cathode electrode of the light emitting unit EMU.

A remaining electrode of the light emitting unit EMU, for example, the third connection electrode ELT3 may configure the intermediate electrode IET. When the light emitting elements LD are connected in a series/parallel structure, power efficiency may be improved compared to a case where the same number of light emitting elements LD are connected only in parallel. In addition, in the pixel PXL in which the light emitting elements LD are connected in the series/parallel structure, because a luminance (e.g., a predetermined luminance) may be expressed through the light emitting elements LD of a remaining series stage even though a short defect or the like occurs at some of the series stages, a possibility of a dark spot defect of the pixel PXL may be reduced. However, the disclosure is not limited thereto, and the light emitting unit EMU may be configured by connecting the light emitting elements LD only in series, or the light emitting unit EMU may be configured by connecting the light emitting elements LD only in parallel.

Each of the light emitting elements LD may include the first end portion EP1 (for example, a p-type end portion) connected to the first power VDD via at least one electrode (for example, the first connection electrode ELT1), the pixel circuit PXC, the first power line PL1, and/or the like, and the second end portion EP2 (for example, an n-type end portion) connected to the second power VSS via at least another electrode (for example, the second connection electrode ELT2), the second power line PL2, and the like. That is, the light emitting elements LD may be connected in the forward direction between the first power VDD and the second power VSS. The light emitting elements LD, which are connected in the forward direction, may configure effective light sources of the light emitting unit EMU.

When the driving current is supplied through the corresponding pixel circuit PXC, the light emitting elements LD may emit light with a luminance corresponding to the driving current. For example, during each frame period, the pixel circuit PXC may supply the driving current corresponding to a grayscale value to be expressed in the corresponding frame to the light emitting unit EMU. Accordingly, while the light emitting elements LD emit light with the luminance corresponding to the driving current, the light emitting unit EMU may express the luminance corresponding to the driving current.

Figure 5:
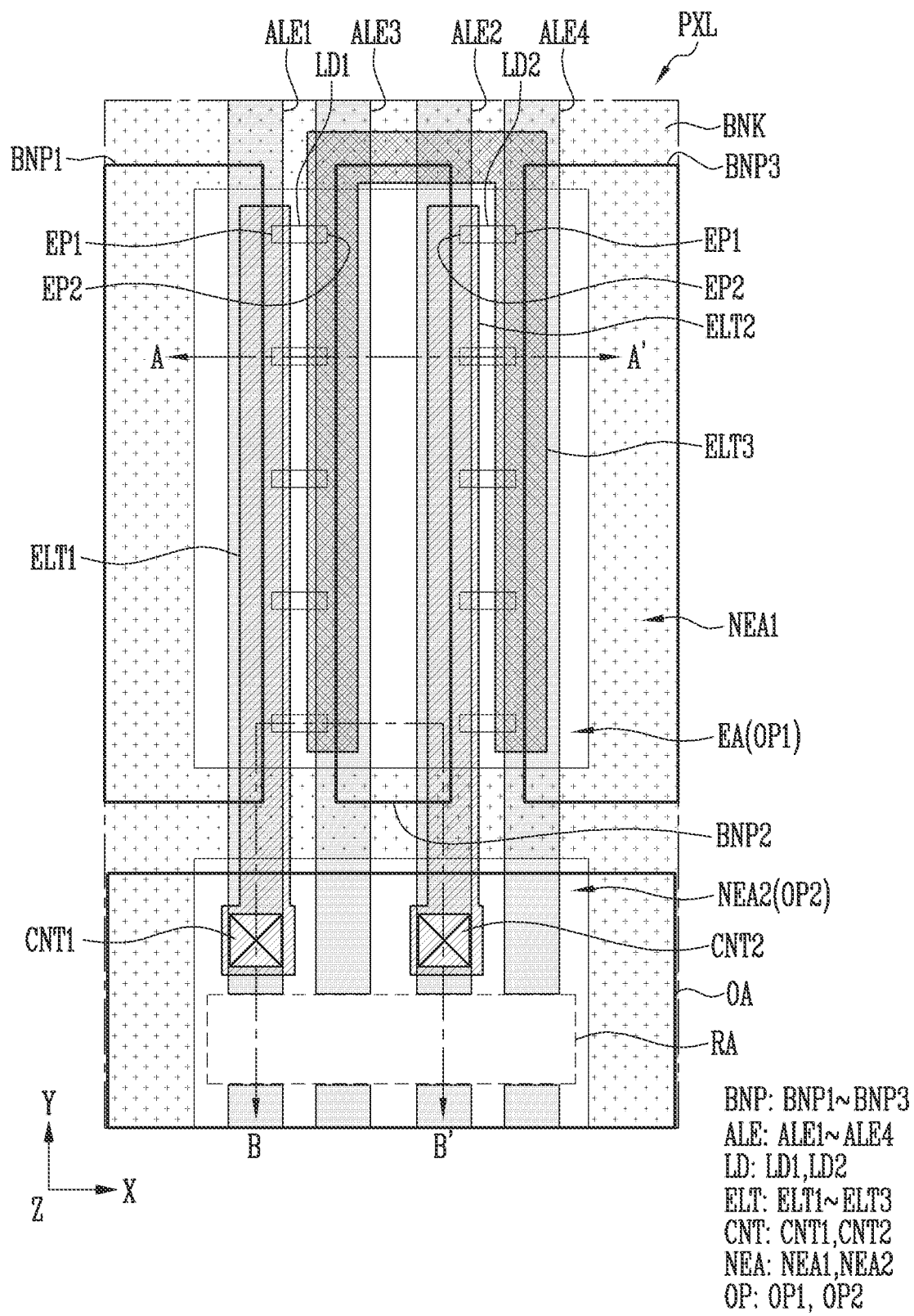
FIG. 5 is a plan view illustrating a pixel according to some embodiments.
Figure 6:
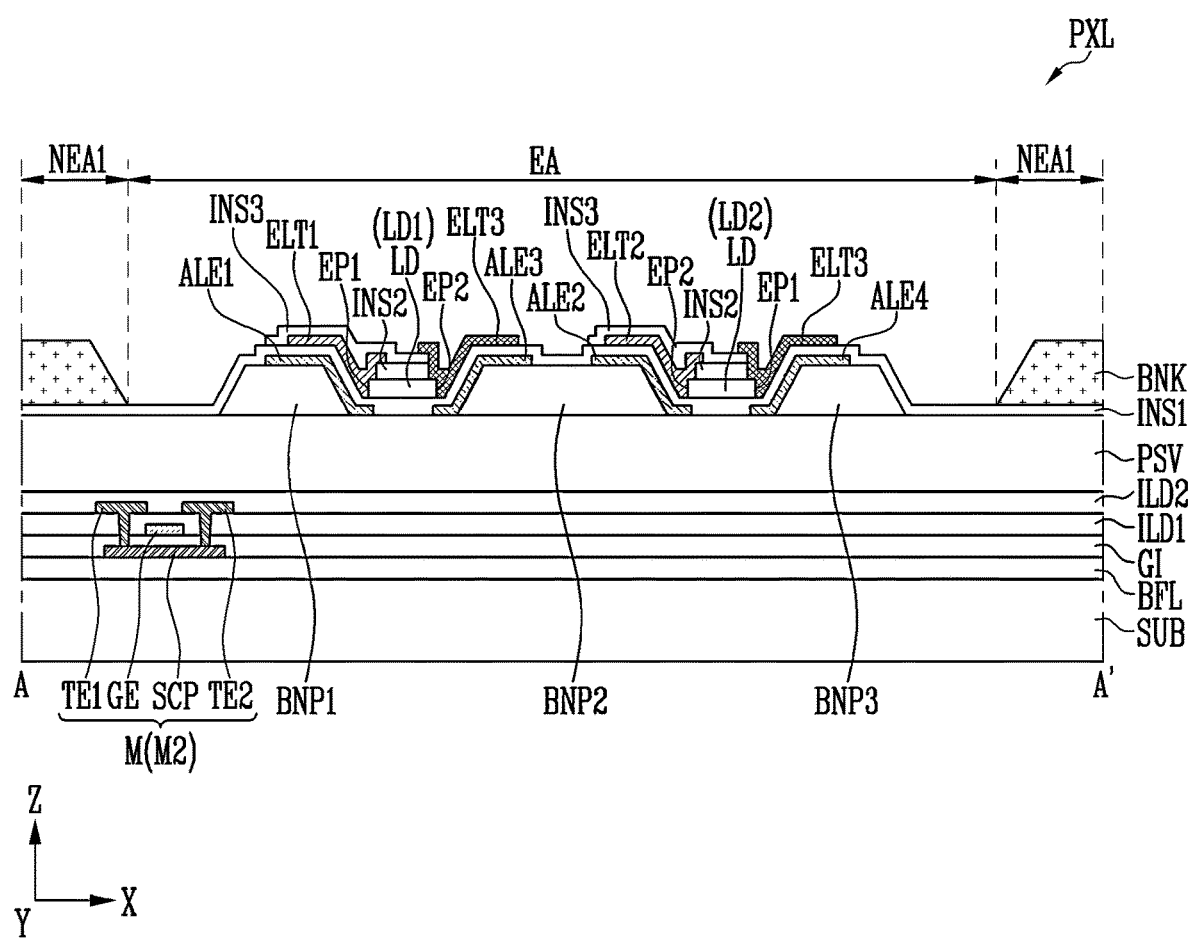
FIG. 6 is cross-sectional view taken along the line A-A' of FIG. 5.
Figure 7:
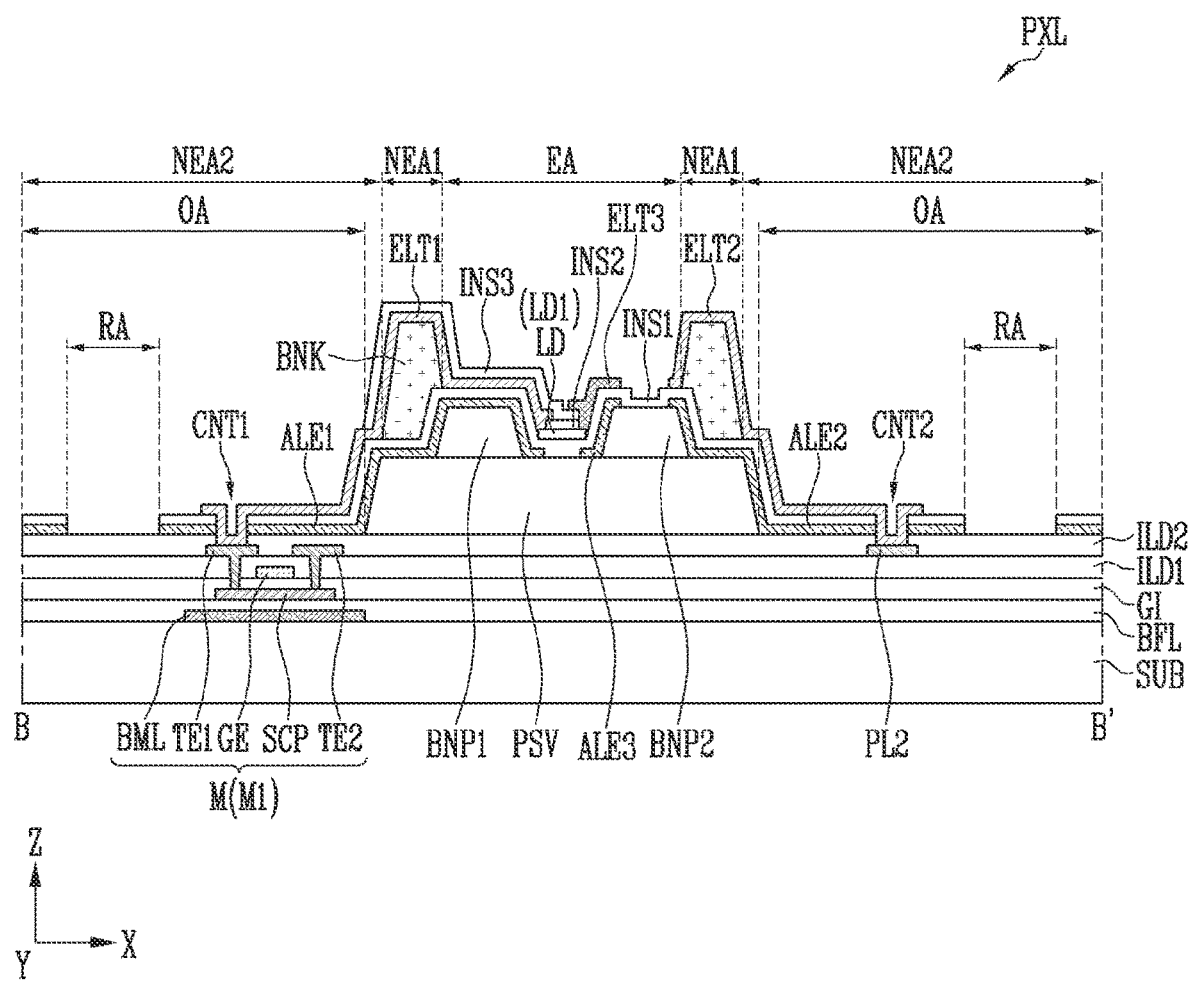
FIG. 7 is a cross-sectional view taken along the line B-B' of FIG. 5.
Figure 8:
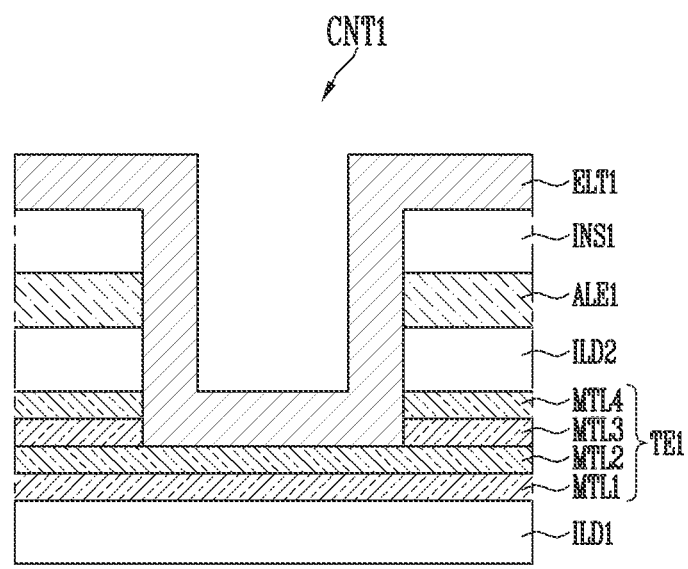
FIGS. 8 and 9 are enlarged cross-sectional views of a contact hole of FIG. 7.
Figure 9:
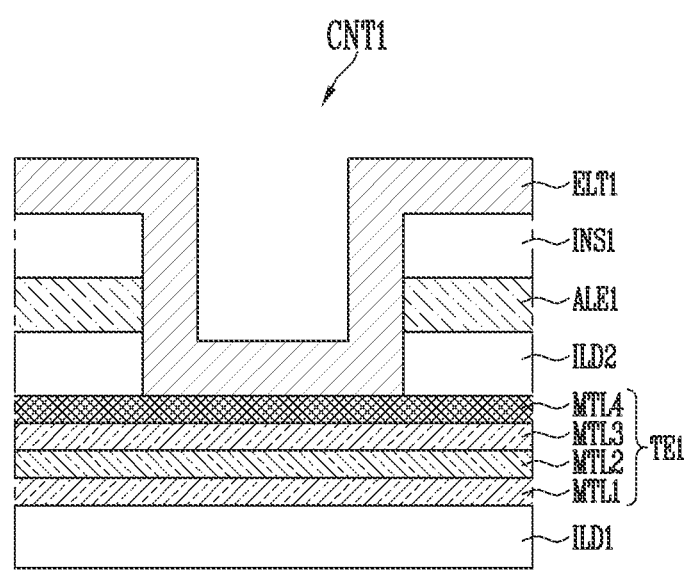

FIG. 5 is a plan view illustrating a pixel according to some embodiments. FIG. 6 is cross-sectional view taken along the line A-A' of FIG. 5. FIG. 7 is a cross-sectional view taken along the line B-B' of FIG. 5. FIGS. 8 and 9 are enlarged cross-sectional views of a contact hole of FIG. 7.

FIG. 5 discloses some embodiments in which each pixel PXL includes the light emitting elements LD located at two series stages, as shown in FIG. 4, but the number of series stages of each pixel PXL may be variously changed according to some embodiments.

Hereinafter, when one or more of the first and second light emitting elements LD1 and LD2 are arbitrarily referred to, or when two or more types of light emitting elements are collectively referred to, the one or more of the first and second light emitting elements LD1 and LD2 or two or more types of light emitting elements are referred to as a "light emitting element LD" or "light emitting elements LD." In addition, when at least one of alignment electrodes including first to fourth alignment electrodes ALE1, ALE2, ALE3, and ALE4 is arbitrarily referenced, the at least one of alignment electrodes ALE1, ALE2, ALE3, and ALE4 is referred to as an "alignment electrode ALE" or "alignment electrodes ALE," and when at least one of connection electrodes including the first to third connection electrodes ELT1 to ELT3 is arbitrarily referenced, the at least one of connection electrodes ELT1 to ELT3 is referred to as a "connection electrode ELT" or "connection electrodes ELT."

Referring to FIG. 5, each pixel PXL may include an emission area EA, a first non-emission area NEA1, and a second non-emission area NEA2. The emission area EA may be an area including the light emitting elements LD, and may emit light. The first non-emission area NEA1 may be located to surround the emission area EA. The first non-emission area NEA1 may be an area in which a bank BNK surrounding the emission area EA is provided. The second non-emission area NEA2 may be spaced apart from the emission area EA with the first non-emission area NEA1 interposed therebetween. In some embodiments, the pixel PXL may include an opening area OA overlapping the non-emission area NEA. The opening area OA may expose the non-emission area NEA. The opening area OA may not overlap the emission area EA, but is not limited thereto. A detailed description of the opening area OA is described later with reference to FIG. 7 and the like.

Each pixel PXL may include patterns BNP, the alignment electrodes ALE, the light emitting elements LD, and the connection electrodes ELT.

The patterns BNP may be provided in at least the emission area EA. The patterns BNP may extend in a second direction (Y-axis direction) and may be spaced apart from each other in a first direction (X-axis direction).

Each of the patterns BNP (also referred to as a "wall pattern" or a "bank pattern") may partially overlap at least one alignment electrode ALE in at least the emission area EA. For example, a first pattern BNP1 may be provided under the first alignment electrode ALE1 to overlap one region of the first alignment electrode ALE1, a second pattern BNP2 may be provided under the second and third alignment electrodes ALE2 and ALE3 to overlap one regions of the second and third alignment electrodes ALE2 and ALE3, and a third pattern BNP3 may be provided under the fourth alignment electrode ALE4 to overlap one region of the fourth alignment electrodes ALE4.

As the patterns BNP are provided under one region of each of the alignment electrodes ALE, one region of each of the alignment electrodes ALE may protrude in an upper direction of the pixel PXL, that is, a third direction (Z-axis direction) in a region in which the patterns BNP are formed. When the patterns BNP and/or the alignment electrodes ALE include a reflective material, a reflective wall structure may be formed around the light emitting elements LD. Accordingly, because the light emitted from the light emitting elements LD may be emitted to the upper direction of the pixel PXL (for example, in a front direction of the display panel PNL including a viewing angle range, such as a predetermined viewing angle range), emission efficiency of the display panel PNL may be improved.

The alignment electrodes ALE may be provided in at least the emission area EA. The alignment electrodes ALE may extend along the second direction (Y-axis direction) and may be spaced apart from each other along the first direction (X-axis direction). The alignment electrodes ALE may extend from the emission area EA to the second non-emission area NEA2 through the first non-emission area NEA1. The alignment electrodes ALE may be disconnected in a separation area RA in the second non-emission area NEA2 and may be separated from the alignment electrodes ALE of an adjacent pixel PXL. Meanwhile, in other embodiments, at least one alignment electrode ALE may not be disconnected in the separation area RA, and may be integrally connected to at least one alignment electrode ALE of the adjacent pixel PXL.

Each of the alignment electrodes ALE may be positioned on at least one of the patterns BNP. For example, the first alignment electrode ALE1 may be positioned on one region of the first pattern BNP1, the second and third alignment electrodes ALE2 and ALE3 may be positioned on different regions of the second pattern BNP2, and the fourth alignment electrode ALE4 may be positioned on one region of the third pattern BNP3. In some embodiments, when the third alignment electrode ALE3 is positioned between the first and second alignment electrodes ALE1 and ALE2, the third alignment electrode ALE3 may be positioned one side (or left) region of the second pattern BNP2, and the second alignment electrode ALE2 may be positioned in another side (or right) region of the second pattern BNP2.

A pair of alignment electrodes ALE adjacent to each other may receive different signals during an alignment step of the light emitting elements LD. For example, when the first alignment electrode ALE1, the third alignment electrode ALE3, the second alignment electrode ALE2, and the fourth alignment electrode ALE4 are sequentially arranged along the first direction (X-axis direction) in the emission area EA, the first and third alignment electrodes ALE1 and ALE3 may form a pair and receive different alignment signals, and the second and fourth alignment electrodes ALE2 and ALE4 may form a pair and receive different alignment signals.

In some embodiments, the second and third alignment electrodes ALE2 and ALE3 may receive the same signal in the alignment step of the light emitting elements LD. The second and third alignment electrodes ALE2 and ALE3 may be integrally or non-integrally connected to each other in the alignment step of the light emitting elements LD, but are not limited thereto.

Each of the light emitting elements LD may be aligned between a pair of patterns BNP in the emission area EA. Each of the light emitting elements LD may be electrically connected between a pair of connection electrodes ELT.

The first light emitting element LD1 may be aligned between the first and second patterns BNP1 and BNP2. The first light emitting element LD1 may be electrically connected between the first and third connection electrodes ELT1 and ELT3. For example, the first end portion EP1 of the first light emitting element LD1 may be electrically connected to the first connection electrode ELT1, and the second end portion EP2 of the first light emitting element LD1 may be electrically connected to the third connection electrode ELT3.

The second light emitting element LD2 may be aligned between the second and third patterns BNP2 and BNP3. The second light emitting element LD2 may be electrically connected between the second and third connection electrodes ELT2 and ELT3. For example, the first end portion EP1 of the second light emitting element LD2 may be electrically connected to the third connection electrode ELT3, and the second end portion EP2 of the second light emitting element LD2 may be electrically connected to the second connection electrode ELT2.

For example, the first light emitting element LD1 may be positioned in a left region of the emission area EA, and the second light emitting element LD2 may be positioned in a right region of the emission area EA. However, an arrangement, a connection structure, and/or the like of the light emitting elements LD may be variously changed according to a structure of the light emitting unit EMU, the number of series stages, and/or the like.

Each of the connection electrodes ELT may be provided in at least the emission area EA, and may be located to overlap at least one alignment electrode ALE and/or the light emitting element LD. For example, the connection electrode ELT may be formed on the alignment electrodes ALE and/or the light emitting elements LD to overlap the alignment electrodes ALE and/or the light emitting elements LD, respectively, and may be electrically connected to the light emitting elements LD.

The first connection electrode ELT1 may be located on the first end portions EP1 of the first light emitting elements LD1 and may be electrically connected to the first end portions EP1 of the first light emitting elements LD1.

The second connection electrode ELT2 may be located on the second end portions EP2 of the second light emitting elements LD2 and may be electrically connected to the second end portions EP2 of the second light emitting elements LD2. In addition, the second connection electrode ELT2 may be electrically connected to the first light emitting elements LD1 via at least another connection electrode ELT and/or the light emitting element LD. For example, the second connection electrode ELT2 may be electrically connected to the second end portions EP2 of the first light emitting elements LD1 via the third connection electrode ELT3.

The third connection electrode ELT3 may be located on the second end portions EP2 of the first light emitting elements LD1 and may be electrically connected to the second end portions EP2 of the first light emitting elements LD1. In addition, the third connection electrode ELT3 may be located on the first end portions EP1 of the second light emitting elements LD2 and may be electrically connected to the first end portions EP1 of the second light emitting elements LD2. For example, the third connection electrode ELT3 may electrically connect the second end portions EP2 of the first light emitting elements LD1 and the first end portions EP1 of the second light emitting elements LD2 in the emission area EA. To this end, the third connection electrode ELT3 may have a curved shape. For example, the third connection electrode ELT3 may have a curved or bent structure at a boundary between a region in which at least one first light emitting element LD1 is arranged and a region in which at least one second light emitting element LD2 is arranged.

In addition, the third connection electrode ELT3 may be positioned between the first and second connection electrodes ELT1 and ELT2, and may be electrically connected between the first and second connection electrodes ELT1 and ELT2 through the light emitting elements LD. For example, the third connection electrode ELT3 may be connected to the first connection electrode ELT1 through at least one first light emitting element LD1, and may be connected to the second connection electrode ELT2 through at least one second light emitting element LD2.

In some embodiments, each of the connection electrodes ELT may extend from the emission area EA to the second non-emission area NEA2 through the first non-emission area NEA1.

The connection electrodes ELT may be directly connected to the pixel circuit PXC and/or a power line (e.g., a predetermined power line) to reduce or minimize a contact resistance with the alignment electrodes ALE. For example, the connection electrodes ELT may be connected to the pixel circuit PXC and/or the power line (e.g., the predetermined power line) through the opening area OA. The first connection electrode ELT1 may be connected to the pixel circuit PXC and/or the first power line PL1 through a first contact hole CNT1 formed in the opening area OA, and the second connection electrode ELT2 may be connected to the second power line PL2 through a second contact hole CNT2 formed in the opening area OA. As described above, when the connection electrodes ELT are directly connected to the circuit elements, the alignment electrodes ALE may be separated from the connection electrodes ELT and/or the circuit elements. Accordingly, the contact resistance between the alignment electrodes ALE and the connection electrodes ELT may be reduced or minimized, and a defect due to reactivity between the alignment electrodes ALE and a conductive layer configuring the pixel circuit PXC may be reduced or minimized.

The bank BNK may be provided in the first non-emission area NEA1 to surround the emission area EA and the second non-emission area NEA2. In addition, the bank BNK may be provided in an outer portion of each pixel PXL and/or between adjacent pixels PXL so as to include a plurality of openings OP corresponding to the emission area EA and the second non-emission area NEA2 of the pixel PXL. For example, the bank BNK may include a first opening OP1 overlapping the emission area EA and a second opening OP2 overlapping the second non-emission area NEA2. That is, the bank BNK may include the first opening OP1 defining the emission area EA and the second opening OP2 defining the second non-emission area NEA2.

The bank BNK may form a dam structure defining the emission area EA to which the light emitting elements LD are to be supplied in a step of supplying the light emitting elements LD to each of the pixels PXL. For example, as the emission area EA is partitioned by the bank BNK, a desired type and/or amount of light emitting element ink may be supplied to the emission area EA.

The bank BNK may include at least one light blocking and/or reflective material. Accordingly, light leakage between adjacent pixels PXL may be reduced or prevented. For example, the bank BNK may include at least one black matrix material, a color filter material, and/or the like. For example, the bank BNK may be formed in a black opaque pattern capable of blocking transmission of light. In some embodiments, a reflective layer or the like may be formed on a surface (for example, a sidewall) of the bank BNK so as to increase the light efficiency of each pixel PXL.

Hereinafter, a cross-sectional structure of each pixel PXL is described in detail with reference to FIGS. 6 and 7, centering on the light emitting element LD. FIG. 6 shows a second transistor M2 among various circuit elements configuring the pixel circuit PXC, and FIG. 7 shows a first transistor M1. Hereinafter, when the first transistor M1 and the second transistor M2 are not required to be separately specified, the first transistor M1 and the second transistor M2 are collectively referred to as a "transistor M." Meanwhile, a structure, a position of each layer, and/or the like of the transistors M are/is not limited to the embodiments of FIGS. 6 and 7, and may be variously changed according to other embodiments.

Referring to FIGS. 6 and 7, circuit elements (for example, the transistors M and the storage capacitor Cst) configuring the pixel circuit PXC, and various lines connected thereto, may be located on the substrate SUB of the pixels PXL and the display panel PNL including the same according to some embodiments. The alignment electrodes ALE configuring the light emitting unit EMU of the corresponding pixel PXL, the light emitting elements LD, and/or the connection electrodes ELT may be located on the circuit elements.

For example, the substrate SUB may configure a base member, and may be a rigid or flexible substrate or film. For example, the substrate SUB may be a rigid substrate formed of glass or tempered glass, a flexible substrate (or a thin film) formed of a plastic or metal material, or an insulating layer of at least one layer. A material and/or a physical property of the substrate SUB are/is not limited. In some embodiments, the substrate SUB may be substantially transparent. Here, "substantially transparent" may mean that light may be transmitted at a corresponding transmittance (e.g., a predetermined transmittance) or more. In other embodiments, the substrate SUB may be translucent or opaque. In addition, the substrate SUB may include a reflective material according to some embodiments.

The transistor M may be located on the substrate SUB. Each transistor M may include a semiconductor pattern SCP, a gate electrode GE, first and second transistor electrodes TE1 and TE2, and may selectively further include a lower metal layer BML.

The lower metal layer BML may be located on the substrate SUB. The lower metal layer BML may overlap the gate electrode GE and/or the semiconductor pattern SCP of at least one transistor M (for example, the first transistor M1).

A buffer layer BFL may be located on the substrate SUB. The buffer layer BFL may reduce or prevent impurities from being diffused into each circuit element. The buffer layer BFL may be configured of a single layer, but may be configured of multiple layers of at least two or more layers. When the buffer layer BFL is formed of multiple layers, each layer may be formed of the same material or may be formed of different materials.

The semiconductor pattern SCP may be located on the buffer layer BFL. For example, each semiconductor pattern SCP may include a first region that is in contact with the first transistor electrode TE1, a second region that is in contact with the second transistor electrode TE2, and a channel region positioned between the first and second regions. According to some embodiments, one of the first and second regions may be a source region and the other may be a drain region.

According to some embodiments, the semiconductor pattern SCP may be formed of polysilicon, amorphous silicon, oxide semiconductor, or the like. In addition, the channel region of the semiconductor pattern SCP may be an intrinsic semiconductor as a semiconductor pattern that is not doped with an impurity. Each of the first and second regions of the semiconductor pattern SCP may be a semiconductor doped with an impurity (e.g., a predetermined impurity).

A gate insulating layer GI may be located on the semiconductor pattern SCP. For example, the gate insulating layer GI may be located between the semiconductor pattern SCP and the gate electrode GE. The gate insulating layer GI may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The gate electrode GE may be located on the gate insulating layer GI. The gate electrode GE may be located to overlap the semiconductor pattern SCP in the third direction (Z-axis direction) on the gate insulating layer GI.

A first interlayer insulating layer ILD1 may be located on the gate electrode GE. For example, the first interlayer insulating layer ILD1 may be located between the gate electrode GE and the first and second transistor electrodes TE1 and TE2. The first interlayer insulating layer ILD1 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second transistor electrodes TE1 and TE2 may be located on the first interlayer insulating layer ILD1. The first and second transistor electrodes TE1 and TE2 may be located to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the first interlayer insulating layer ILD1 and the gate insulating layer GI. The second transistor electrode TE2 may be electrically connected to the second region of the semiconductor pattern SCP through a contact hole passing through the first interlayer insulating layer ILD1 and the gate insulating layer GI. According to some embodiments, one of the first and second transistor electrodes TE1 and TE2 may be a source electrode, and the other may be a drain electrode.

The second power line PL2 may be located on the first interlayer insulating layer ILD1. The second power line PL2 may be located on the same layer as the first and second transistor electrodes TE1 and TE2. That is, the second power line PL2 may be formed of the same conductive layer as the first and second transistor electrodes TE1 and TE2. For example, the second power line PL2 may be formed concurrently (e.g., substantially simultaneously) in the same process as the first and second transistor electrodes TE1 and TE2, but is not limited thereto.

The first and second transistor electrodes TE1 and TE2 and/or the second power line PL2 may be formed of a plurality of conductive layers. FIGS. 8 and 9 are referred to for a detailed description thereof. For convenience of description, only the first transistor electrode TE1 is shown in FIGS. 8 and 9, and both of the second transistor electrode TE2 and the second power line PL2 are described centering on the first transistor electrode TE1.

Referring to FIGS. 8 and 9, the first transistor electrode TE1 may include first to fourth electrode layers MTL1, MTL2, MTL3, and MTL4. The first to fourth electrode layers MTL1, MTL2, MTL3, and MTL4 may be sequentially stacked on the first interlayer insulating layer ILD1.

At least some of the first to fourth electrode layers MTL1, MTL2, MTL3, and MTL4 may be formed of the same material. For example, as shown in FIG. 8, the first electrode layer MTL1 and the third electrode layer MTL3 may be formed of the same material. In addition, the second electrode layer MTL2 and the fourth electrode layer MTL4 may be formed of the same material. For example, the first electrode layer MTL1 and the third electrode layer MTL3 may be formed of titanium (Ti), and the second electrode layer MTL2 and the fourth electrode layer MTL4 may be formed of copper (Cu), but are not limited thereto.

Alternatively, as shown in FIG. 9, the first electrode layer MTL1 and the third electrode layer MTL3 may be formed of the same material, and the second electrode layer MTL2 and the fourth electrode layer MTL4 may be formed of different materials. For example, the first electrode layer MTL1 and the third electrode layer MTL3 may be formed of titanium (Ti), the second electrode layer MTL2 may be formed of copper (Cu), and the fourth electrode layer MTL4 may be formed of indium tin oxide (ITO), but are not limited thereto.

Referring to FIGS. 6 and 7 again, a second interlayer insulating layer ILD2 may be located on the first and second transistor electrodes TE1 and TE2 and the second power line PL2. The second interlayer insulating layer ILD2 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A protective layer PSV may be located on the circuit elements including the transistors M. The protective layer PSV may be formed of an organic material to flatten a lower step difference. For example, the protective layer PSV may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the protective layer PSV may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

In some embodiments, the protective layer PSV may include the opening area OA exposing the non-emission area NEA. That is, the protective layer PSV may be partially removed in the opening area OA to expose the circuit elements located under the protective layer PSV.

The patterns BNP, the alignment electrodes ALE, the light emitting elements LD, and the connection electrodes ELT may be provided on the protective layer PSV and/or the opening area OA.

The patterns BNP may be located on the protective layer PSV. The patterns BNP may have various shapes according to some embodiments. In some embodiments, the patterns BNP may have a shape protruding from the substrate SUB in the third direction (Z-axis direction). In addition, the patterns BNP may be formed to have an inclined surface inclined at an angle (e.g., a predetermined angle) with respect to the substrate SUB. However, the disclosure is not limited thereto, and the patterns BNP may have a sidewall of a curved surface, a step shape, or the like. For example, the patterns BNP may have a cross section of a semicircle shape, a semi-ellipse shape, or the like.

Electrodes and insulating layers located on the patterns BNP may have a shape corresponding to the patterns BNP. For example, the alignment electrodes ALE located on the patterns BNP may include an inclined surface or a curved surface having a shape corresponding to the shape of the patterns BNP. Accordingly, the patterns BNP may function as a reflective member that improves emission efficiency of the display panel PNL by guiding the light emitted from the light emitting elements LD in the front direction, that is, the third direction (Z-axis direction) of the pixel PXL together with the alignment electrodes ALE provided on the patterns BNP.

The patterns BNP may include at least one organic material and/or inorganic material. For example, the patterns BNP may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the patterns BNP may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The alignment electrodes ALE may be located on the protective layer PSV and the patterns BNP. The alignment electrodes ALE may be located to be spaced apart from each other in the emission area EA. As described above, the alignment electrodes ALE may receive the alignment signal in the alignment step of the light emitting elements LD. Accordingly, the electric field may be formed between the alignment electrodes ALE, and thus the light emitting elements LD supplied to each of the pixels PXL may be aligned between the alignment electrodes ALE.

According to some embodiments, the alignment electrodes ALE may extend from the emission area EA to the second non-emission area NEA2 through the first non-emission area NEA1. The alignment electrodes ALE may be disconnected in the separation area RA in the second non-emission area NEA2, and thereby may be separated from the alignment electrodes ALE of the adjacent pixel PXL. For example, the alignment electrodes ALE exposed by the first insulating layer INS1 may be partially removed in the separation area RA, and may be separated from the alignment electrodes ALE of the adjacent pixel PXL.

Each of the alignment electrodes ALE may include at least one conductive material. For example, the alignment electrodes ALE may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu) or an alloy including the at least one metal, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), or gallium tin oxide (GTO), and at least one conductive material among conductive polymers such as PEDOT, but is not limited thereto.

A first insulating layer INS1 may be located on the alignment electrodes ALE. The first insulating layer INS1 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The bank BNK may be located on the first insulating layer INS1 of the first non-emission area NEA1. For example, the bank BNK may be provided in the first non-emission area NEA1 to surround the emission area EA and the second non-emission area NEA2.

The bank BNK may include at least one organic material and/or an inorganic material. For example, the bank BNK may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank BNK may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The light emitting elements LD may be located on the first insulating layer INS1 of the emission area EA. The light emitting elements LD may be located between the alignment electrodes ALE on the first insulating layer INS1. The light emitting elements LD may be prepared in a form dispersed in a solution (e.g., a predetermined solution), and may be supplied to each of the pixels PXL through an inkjet printing method or the like. For example, the light emitting elements LD may be dispersed in a volatile solvent and provided in the emission area of each of the pixels PXL. In the process of aligning the light emitting elements LD, when the alignment signal is supplied through the alignment electrodes ALE, while the electric field is formed between the alignment electrodes ALE, the light emitting elements LD may be aligned. After the light emitting elements LD are aligned, the solvent may be volatilized or removed in another method to stably arrange the light emitting elements LD between the alignment electrodes ALE.

A second insulating layer INS2 may be located on the light emitting elements LD. The second insulating layer INS2 may be partially located on the light emitting elements LD. When the second insulating layer INS2 is formed on the light emitting elements LD after the alignment of the light emitting elements LD is completed, separation of the light emitting elements LD from an aligned position may be reduced or prevented. The second insulating layer INS2 may be located on the light emitting elements LD, and may expose the first and second end portions EP1 and EP2 of the light emitting elements LD.

The second insulating layer INS2 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The connection electrodes ELT may be located on the first and second end portions EP1 and EP2 of the light emitting elements LD exposed by the second insulating layer INS2. The connection electrodes ELT may be directly located on the first and second end portions EP1 and EP2 of the light emitting elements LD, and thus the connection electrodes ELT may be in contact with the first and second end portions EP1 and EP2 of the light emitting elements LD.

The connection electrodes ELT may be configured of a plurality of conductive layers and may be located on different layers. The first and second connection electrodes ELT1 and ELT2 may be located on the second insulating layer INS2, and the third connection electrode ELT3 may be located on the first and second connection electrodes ELT1 and ELT2. In this case, the first connection electrode ELT1 and the second connection electrode ELT2 may be located on the same layer, and the third connection electrode ELT3 may be located on a layer that is different from that of the first and second connection electrodes ELT1 and ELT2. As described above, when the connection electrodes ELT are configured of the plurality of conductive layers, an insulating layer may be located between the plurality of conductive layers. For example, a third insulating layer INS3 may be further located between the first and second connection electrodes ELT1 and ELT2 and the third connection electrodes ELT3. The third insulating layer INS3 may cover the first and second connection electrodes ELT1 and ELT2, and may expose the second end portion EP2 of the light emitting element LD. The third connection electrode ELT3 may be located on the second end portion EP2 of the first light emitting element LD1 and the first end portion EP1 of the second light emitting element LD2 exposed by the third insulating layer INS3. As described above, when the third insulating layer INS3 is located between the connection electrodes ELT formed of different conductive layers, because the connection electrodes ELT may be stably separated by the third insulating layer INS3, electrical stability between the first and second end portions EP1 and EP2 of the light emitting elements LD may be secured. Accordingly, a short defect may be effectively prevented from occurring between the first and second end portions EP1 and EP2 of the light emitting elements LD.

The connection electrodes ELT may be electrically connected to the circuit elements including the transistor M located under the connection electrodes ELT through the opening area OA. For example, the connection electrodes ELT may be electrically connected to the circuit elements including the transistor M through respective contact holes CNT formed in the opening area OA. The first connection electrode ELT1 may be in contact with the first transistor electrode TE1 of the transistor M through the first contact hole CNT1 passing through the first insulating layer INS1, the first alignment electrode ALE1, and/or the second interlayer insulating layer ILD2. In addition, the second connection electrode ELT2 may be in contact with the second power line PL2 through the second contact hole CNT2 passing through the first insulating layer INS1, the second alignment electrode ALE2, and/or the second interlayer insulating layer ILD2.

As described above, when the first and second transistor electrodes TE1 and TE2 and/or the second power line PL2 are configured of a plurality of electrode layers, the contact holes CNT may remove corresponding portions of, or pass through, some of a plurality of electrode layers configuring the transistor electrodes TE1 and TE2 and/or the second power line PL2. For example, as shown in FIG. 8, the first contact hole CNT1 may remove an area of, or pass through, the third electrode layer MTL3 and/or the fourth electrode layer MTL4 to expose the second electrode layer MTL2. In this case, the first connection electrode ELT1 may be in direct contact with the second electrode layer MTL2 exposed by the first contact hole CNT1.

Alternatively, as shown in FIG. 9, the first contact hole CNT1 may expose the fourth electrode layer MTL4. In this case, the first connection electrode ELT1 may be in direct contact with the fourth electrode layer MTL4 exposed by the first contact hole CNT1.

Referring to FIGS. 6 and 7, each of the connection electrodes ELT may be formed of various transparent conductive materials. For example, the connection electrodes ELT may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a suitable transmittance (e.g., a predetermined transmittance). Accordingly, the light emitted from the first and second end portions EP1 and EP2 of the light emitting elements LD may pass through the connection electrodes ELT, and may be emitted to the outside of the display panel PNL.

Figure 10:
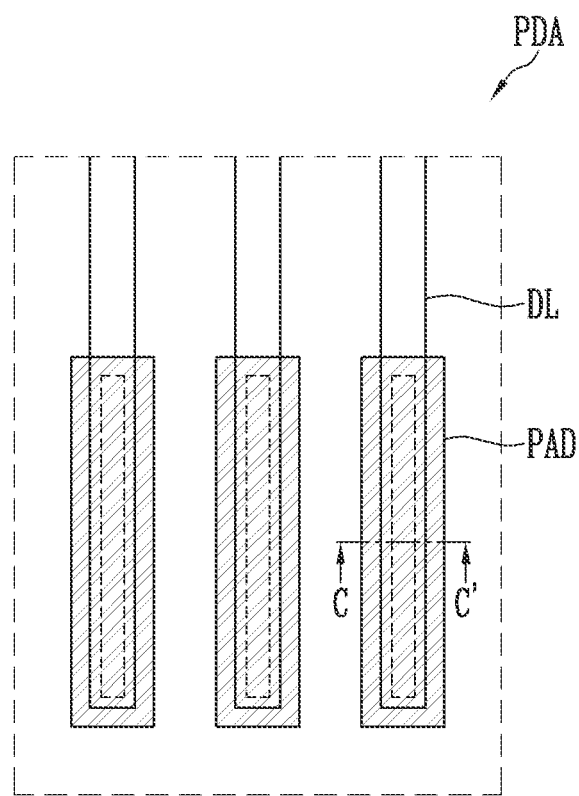
FIG. 10 is a plan view illustrating a pad area of FIG. 2.
Figure 11:
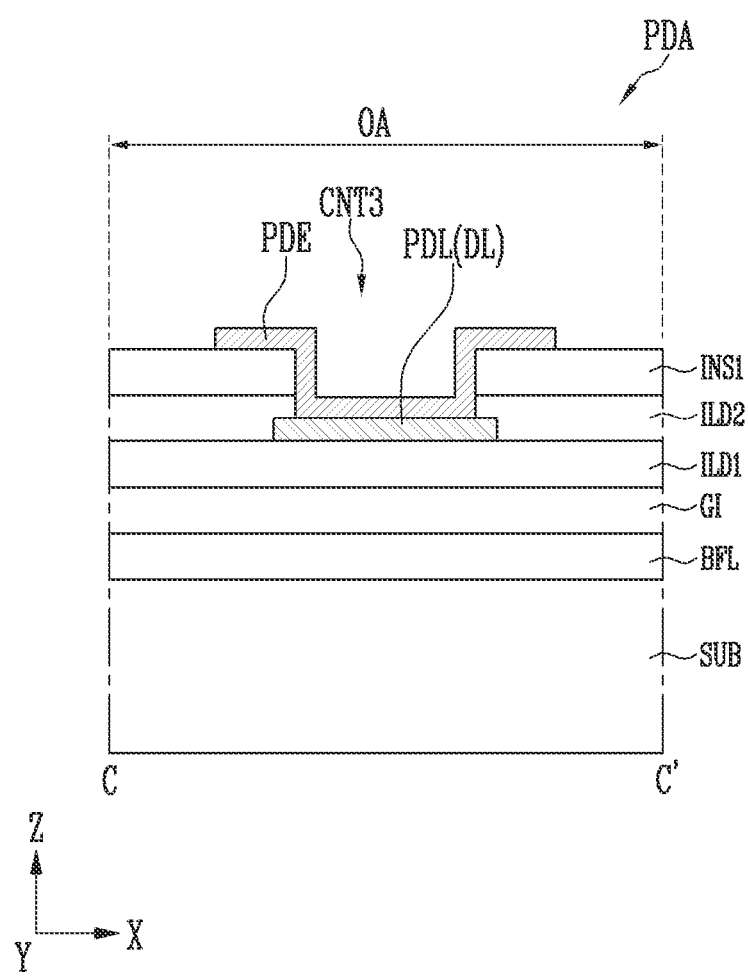
FIG. 11 is a cross-sectional view taken along the line C-C' of FIG. 10.

FIG. 10 is a plan view illustrating the pad area of FIG. 2. FIG. 11 is a cross-sectional view taken along the line C-C' of FIG. 10.

Referring to FIGS. 6, 7, 10, and 11, the pad area PDA may be located in the opening area OA of the protective layer PSV described above. That is, the protective layer PSV may be partially removed in the pad area PDA.

The pad PAD may be located in the pad area PDA, and may include a pad line PDL and a pad electrode PDE. The pad line PDL may be substantially the same as the data line DL described above.

The pad line PDL may be formed of the same conductive layer as the first and second transistor electrodes TE1 and TE2 and/or the second power line PL2 described above. For example, the pad line PDL may be formed concurrently (e.g., substantially simultaneously) in the same process as the first and second transistor electrodes TE1 and TE2 and/or the second power line PL2, but the present disclosure is not limited thereto.

The pad electrode PDE may be located on the pad line PDL. The pad electrode PDE may be in contact with the pad line PDL through a third contact hole CNT3 passing through the first insulating layer INS1 and the second interlayer insulating layer ILD2. The pad electrode PDE may be formed of the same conductive layer as the connection electrode ELT described above. For example, the pad electrode PDE may be formed of the same conductive layer as the first connection electrode ELT1 and/or the second connection electrode ELT2. The pad electrode PDE may be formed concurrently (e.g., substantially simultaneously) in the same process as the first connection electrode ELT1 and/or the second connection electrode ELT2, but is not limited thereto.

In addition, because the substrate SUB, the buffer layer BFL, the gate insulating layer GI, the first interlayer insulating layer ILD1, the second interlayer insulating layer ILD2, and the first insulating layer INS1 are described with reference to FIGS. 6 and 7, repetitive content relating thereto is omitted.

According to the above-described embodiments, the connection electrodes ELT and the pad electrode PDE may be directly connected to the circuit element located under the connection electrodes ELT and the pad electrode PDE through the opening area OA in which the protective layer PSV is partially removed. Accordingly, because the alignment electrodes ALE may be separated from the connection electrodes ELT and/or the circuit element, the contact resistance of the alignment electrodes ALE and the connection electrodes ELT may be reduced or minimized, and the defect due to the reactivity between the alignment electrodes ALE and the conductive layer configuring the circuit element may be reduced or minimized.

Subsequently, a method of manufacturing the display device according to the embodiments described above is described.

FIGS. 12 to 16 are cross-sectional views illustrating a method of manufacturing a display device according to some embodiments. FIGS. 17 to 20 are enlarged cross-sectional views illustrating a manufacturing step of FIG. 15. For convenience of description, a cross-section corresponding to FIGS. 7 and 11 are shown in each of FIGS. 12 to 16.

Figure 12:
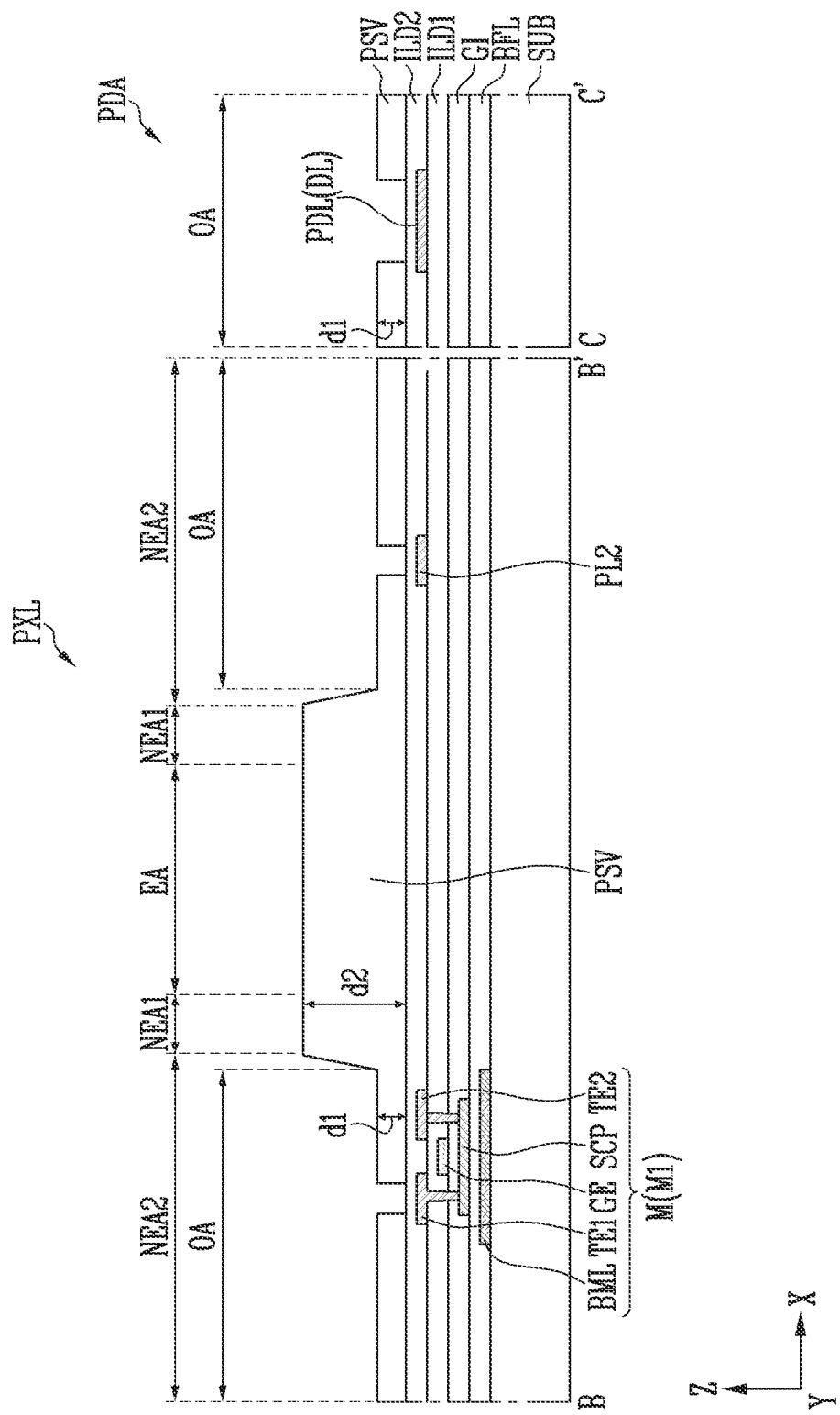
FIGS. 12 to 16 are cross-sectional views illustrating a method of manufacturing a display device according to some embodiments.

Referring to FIG. 12, the circuit elements including the transistor M and the like are formed on the substrate SUB, and the protective layer PSV is formed on the transistor M. The protective layer PSV may be formed in different thicknesses (e.g., to have varying thickness) according to an area in the pixel PXL. For example, the protective layer PSV of the opening area OA may be formed in a first thickness d1, and the protective layer PSV of the emission area EA may be formed in a second thickness d2. According to some embodiments, the protective layer PSV may expose the second interlayer insulating layer ILD2 located under the protective layer PSV to form the contact hole CNT in the opening area OA. As an example, the protective layer PSV may be formed in different thicknesses according to the area in the pixel PXL by using a halftone mask including mask areas of which transmittances are different.

The protective layer PSV may be formed using an organic material such as acrylic resin (acrylates resin), an epoxy resin, a phenolic resin, a polyamides resin, a polyimide resin, a polyesters resin, polyphenylenesulfides resin, or benzocyclobutene (BCB).

Figure 13:
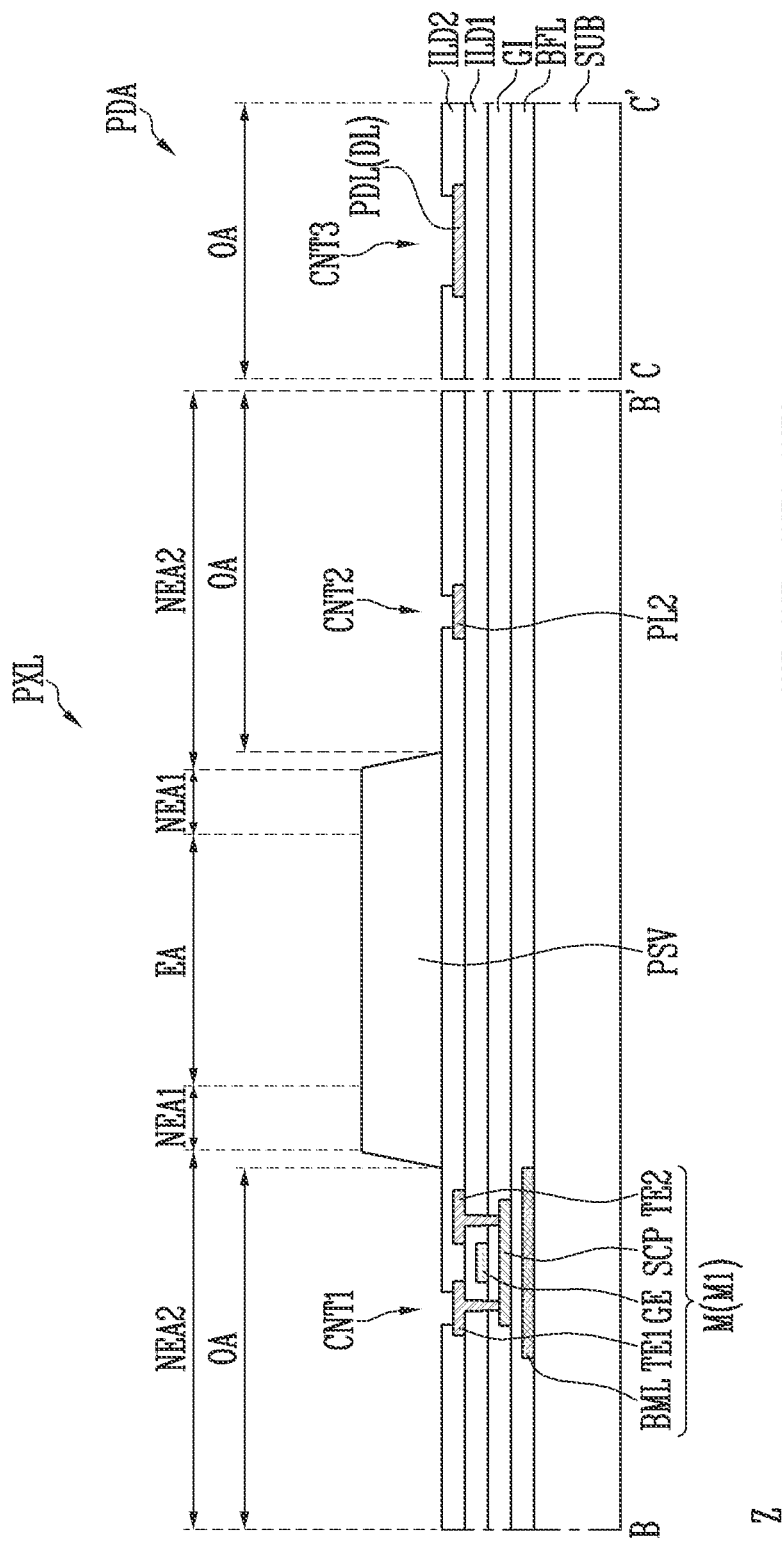

Referring to FIG. 13, subsequently, the opening area OA is formed by etching the protective layer PSV. In a process of forming the opening area OA(s), the second interlayer insulating layer ILD2 may be etched to form the contact hole(s) CNT. Accordingly, the opening area OA and/or the contact hole CNT may partially expose the circuit elements located under the opening area OA and/or the contact hole CNT. For example, the first transistor electrode TE1 of the transistor M, the second power line PL2, and/or the pad line PDL may be exposed through the opening area OA of the protective layer PSV and/or the contact hole CNT of the second interlayer insulating layer ILD2. As described above, when the protective layer PSV includes the partially removed opening area OA, the connection electrodes ELT and the pad electrode PDE formed on the protective layer PSV may be easily connected to the circuit elements formed under the protective layer PSV.

Figure 14:
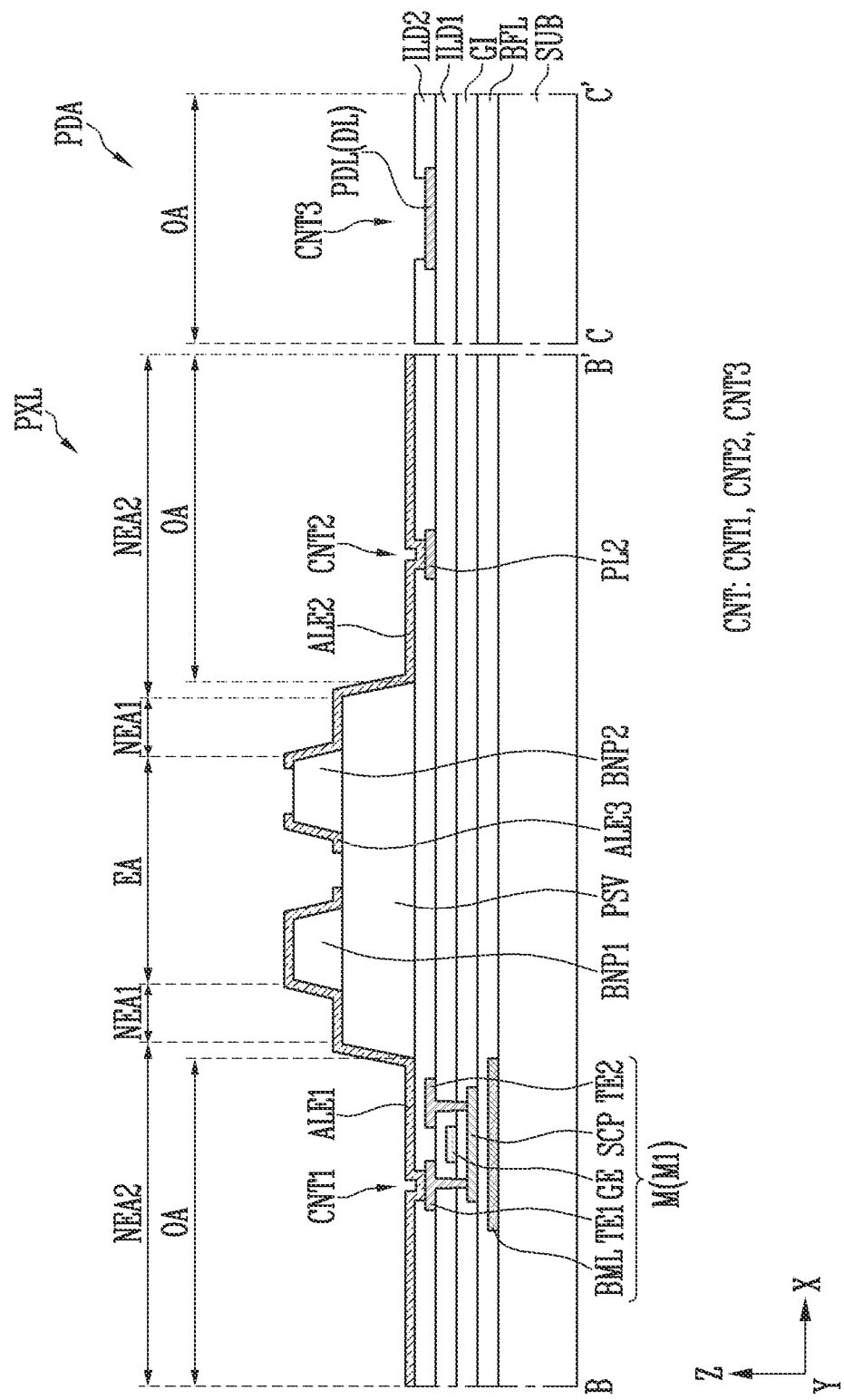

Referring to FIG. 14, subsequently, the patterns BNP are formed on the protective layer PSV, and the alignment electrodes ALE that are spaced apart from each other are formed on the patterns BNP. The alignment electrodes ALE may extend from the emission area EA to the second non-emission area NEA2 through the first non-emission area NEA1.

Figure 15:
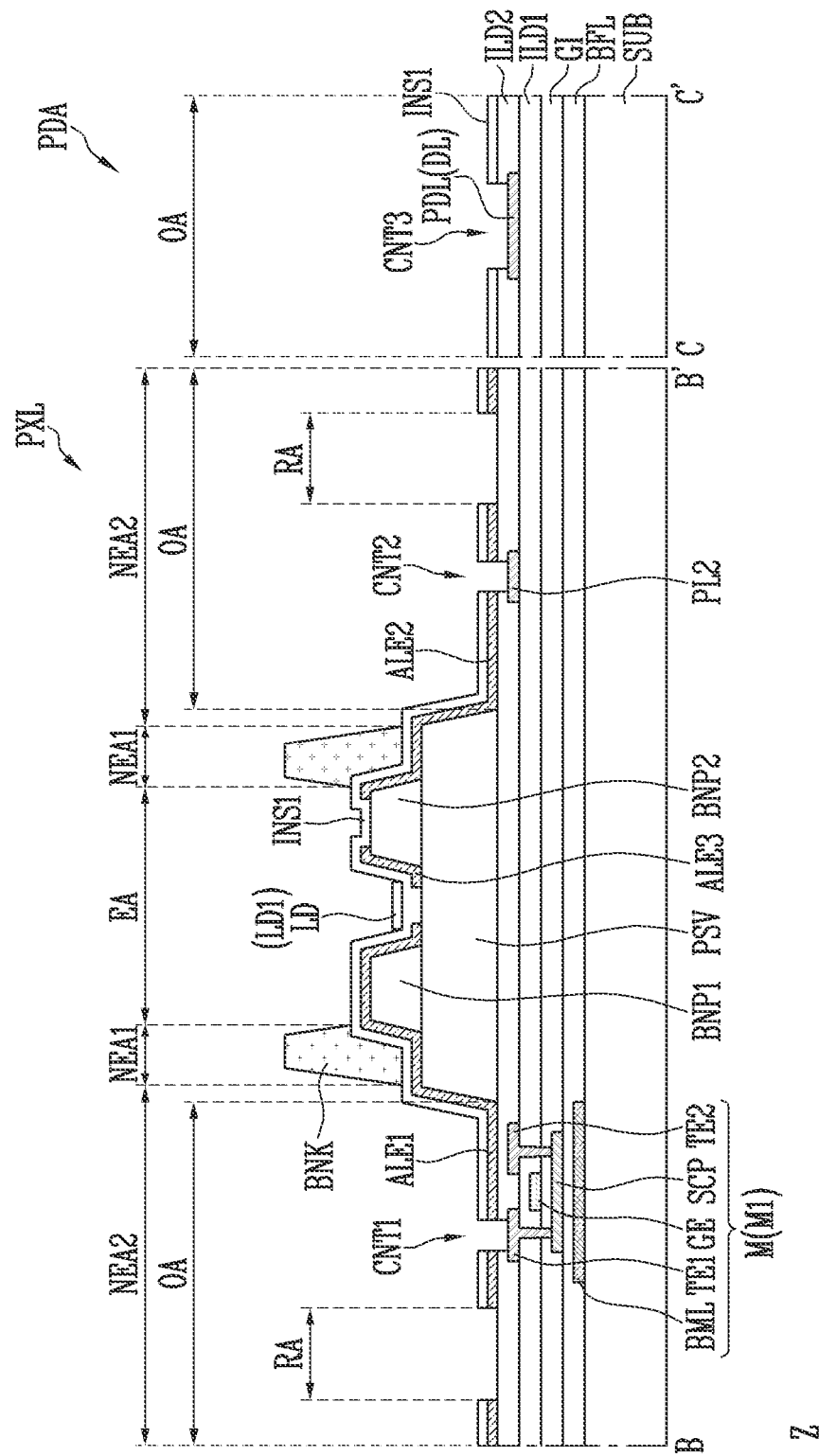

Referring to FIG. 15, subsequently, the first insulating layer INS1 and the bank BNK are formed on the alignment electrodes ALE. The light emitting elements LD may be supplied into the emission area EA partitioned by the bank BNK, and may be aligned between the alignment electrodes ALE spaced apart from each other.

After the light emitting elements LD are aligned, the alignment electrodes ALE may be partially removed in the separation area RA in the second non-emission area NEA2 and may be separated from the alignment electrodes ALE of the adjacent pixel PXL. For example, the alignment electrodes ALE exposed by the first insulating layer INS1 may be partially removed in the separation area RA, and may be separated from the alignment electrodes ALE of the adjacent pixel PXL. In a process of removing the alignment electrodes ALE in the separation area RA, the alignment electrodes ALE formed at a position of the contact hole CNT may also be partially removed. Accordingly, the first insulating layer INS1, the alignment electrodes ALE, and the second insulating layer INS2 may be partially removed, and thus the contact hole(s) CNT may partially expose the circuit elements located under the contact hole CNT(s) (e.g., respectively).

As described above, when the first and second transistor electrodes TE1 and TE2 and/or the second power line PL2 are configured of a plurality of conductive layers, some of the conductive layers forming the first and second transistor electrodes TE1 and TE2 and/or the second power line PL2 may be removed in removing the alignment electrode ALE.

FIGS. 17 to 20 are referred to for a detailed description thereof. For convenience of description, in FIGS. 17 to 20, both the second transistor electrode TE2 and the second power line PL2 are similar to the description centering on the first transistor electrode TE1 with reference to FIGS. 17 to 20.

Figure 17:
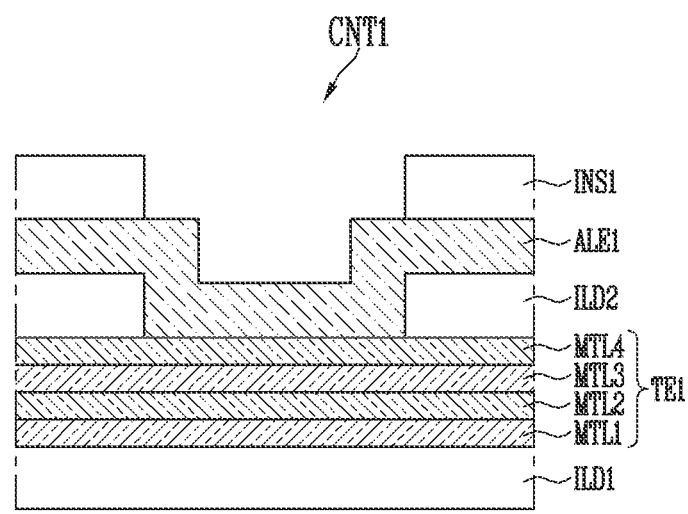
FIGS. 17 to 20 are enlarged cross-sectional views illustrating a manufacturing step of FIG. 15.
Figure 18:
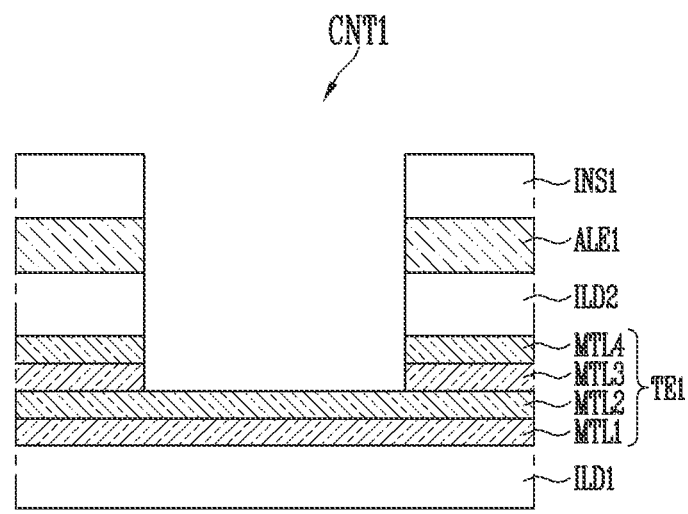

Referring to FIG. 17, the first transistor electrode TE1 may include the first to fourth electrode layers MTL1, MTL2, MTL3, and MTL4. The first to fourth electrode layers MTL1, MTL2, MTL3, and MTL4 may be sequentially stacked on the first interlayer insulating layer ILD1. At least some of the first to fourth electrode layers MTL1, MTL2, MTL3, and MTL4 may be formed of the same material. For example, the first electrode layer MTL1 and the third electrode layer MTL3 may be formed of the same material. In addition, the second electrode layer MTL2 and the fourth electrode layer MTL4 may be formed of the same material. For example, the first electrode layer MTL1 and the third electrode layer MTL3 may be formed of titanium (Ti), and the second electrode layer MTL2 and the fourth electrode layer MTL4 may be formed of copper (Cu). In this case, as shown in FIG. 18, the third electrode layer MTL3 and the fourth electrode layer MTL4 may be partially removed in a process of removing the alignment electrode ALE. That is, the first contact hole CNT1 passing through the first insulating layer INS1, the first alignment electrode ALE1, and the second interlayer insulating layer ILD2 may expose the second electrode layer MTL2. In this case, as shown in FIG. 8, the first connection electrode ELT1 may be in direct contact with the second electrode layer MTL2 exposed by the first contact hole CNT1.

Figure 19:
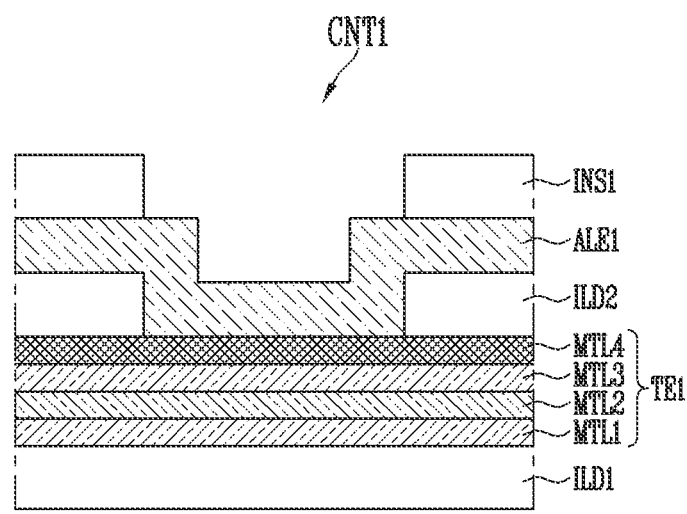
Figure 20:
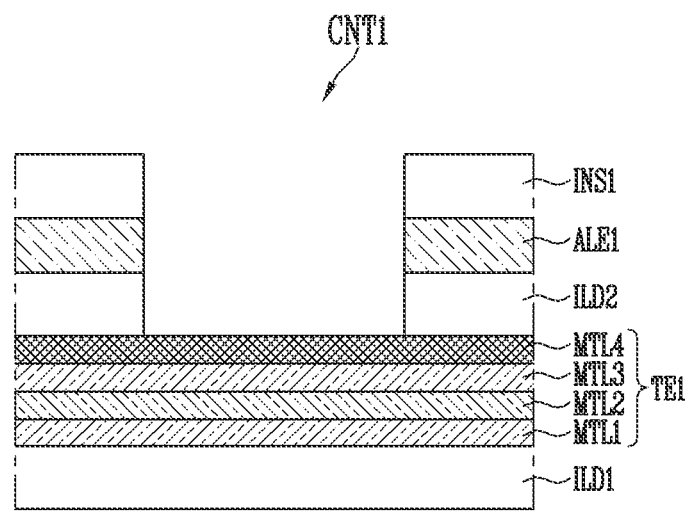

Alternatively, as shown in FIG. 19, the first electrode layer MTL1 and the third electrode layer MTL3 may be formed of the same material, and the second electrode layer MTL2 and the fourth electrode layer MTL4 may be respectively formed of different materials. For example, the first electrode layer MTL1 and the third electrode layer MTL3 may be formed of titanium (Ti), the second electrode layer MTL2 may be formed of copper (Cu), and the fourth electrode layer MTL4 may be formed of indium tin oxide (ITO). In this case, as shown in FIG. 20, even though the alignment electrode ALE is removed, the first to third electrode layers MTL3 located under the fourth electrode layer MTL4 formed of indium tin oxide (ITO) may be protected. That is, the first contact hole CNT1 passing through the first insulating layer INS1, the first alignment electrode ALE1, and the second interlayer insulating layer ILD2 may expose the fourth electrode layer MTL4. In this case, as shown in FIG. 9, the first connection electrode ELT1 may be in direct contact with the fourth electrode layer MTL4 exposed by the first contact hole CNT1.

Figure 16:
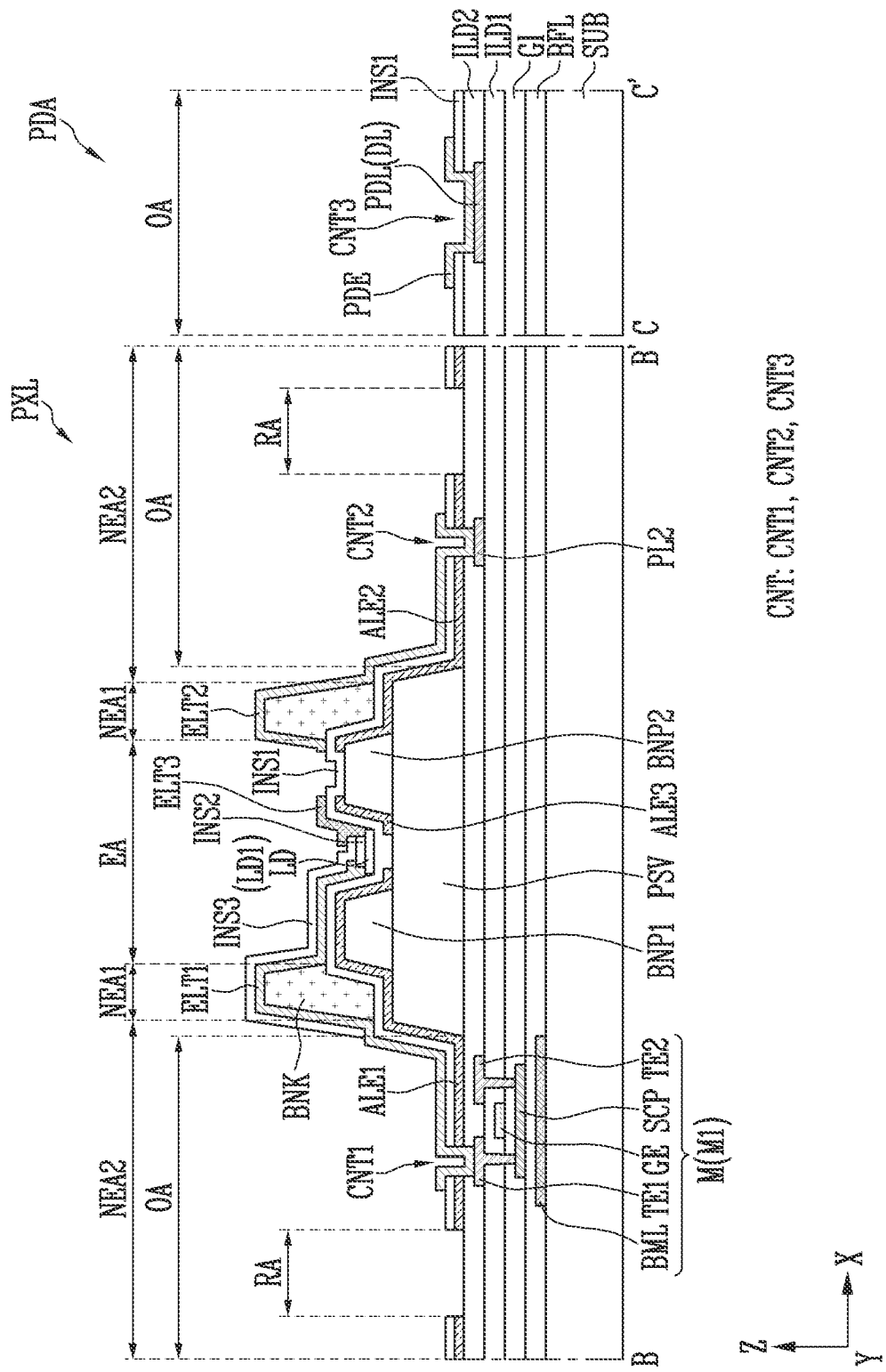

Referring to FIG. 16, subsequently, the second insulating layer INS2 is formed, and the connection electrodes ELT and the pad electrode PDE are formed.

The second insulating layer INS2 may be partially formed on the light emitting elements LD to expose the first and second end portions EP1 and EP2 of the light emitting elements LD.

The connection electrodes ELT may be formed on the first and second end portions EP1 and EP2 of the light emitting elements LD exposed by the second insulating layer INS2. The connection electrodes ELT may be suitably connected to the circuit elements located under the connection electrodes ELT through the opening area OA in which the protective layer PSV is partially removed. For example, the first connection electrode ELT1 may be in contact with the first transistor electrode TE1 of the transistor M through the first contact hole CNT1 formed in the opening area OA, and the second connection electrode ELT2 may be in contact with the second power line PL2 through the second contact hole CNT2 formed in the opening area OA.

The connection electrodes ELT may be configured of a plurality of conductive layers, and may be formed on different layers. The first and second connection electrodes ELT1 and ELT2 may be formed on the second insulating layer INS2, and the third connection electrode ELT3 may be formed on the first and second connection electrodes ELT1 and ELT2. In this case, the first connection electrode ELT1 and the second connection electrode ELT2 may be formed on the same layer, and the third connection electrode ELT3 may be formed on a layer that is different from that of the first and second connection electrodes ELT1 and ELT2. As described above, when the connection electrodes ELT are configured of the plurality of conductive layers, an insulating layer may be formed between the plurality of conductive layers. For example, the third insulating layer INS3 may be further formed between the first and second connection electrodes ELT1 and ELT2 and the third connection electrode ELT3. The third insulating layer INS3 may cover the first and second connection electrodes ELT1 and ELT2, and may expose the second end portion EP2 of the light emitting element LD. The third connection electrode ELT3 may be located on the second end portion EP2 of the light emitting element LD exposed by the third insulating layer INS3.

The pad electrode PDE may be formed on the pad line PDL. The pad electrode PDE may be easily connected to the pad line PDL located under the pad electrode PDE through the opening area OA in which the protective layer PSV is partially removed. For example, the pad electrode PDE may be in contact with the pad line PDL through the third contact hole CNT3 formed in the opening area OA.

The pad electrode PDE may be formed concurrently (e.g., substantially simultaneously) in the same process as the connection electrode ELT. That is, the pad electrode PDE may be formed of the same conductive layer as the connection electrode ELT. For example, the pad electrode PDE may be formed concurrently (e.g., substantially simultaneously) in the same process as the first connection electrode ELT1 and/or the second connection electrode ELT2. That is, the pad electrode PDE may be formed of the same conductive layer as the first connection electrode ELT1 and/or the second connection electrode ELT2.

According to the above-described embodiments, the connection electrodes ELT and the pad electrode PDE may be easily connected to the circuit element located under the connection electrodes ELT and the pad electrode PDE through the opening area OA in which the protective layer PSV is partially removed. Accordingly, because the alignment electrodes ALE may be separated from the connection electrodes ELT, the pixel circuit PXC, and/or the like, a resistance due to contact of the alignment electrodes ALE and the connection electrodes ELT may be reduced or minimized, and a the likelihood of a potential defect due to the reactivity between the alignment electrodes ALE and the conductive layer configuring the circuit element may be reduced or minimized as described above.

Those skilled in the art may understand that the disclosure may be implemented in a modified form without departing from the above-described essential characteristic. Therefore, the disclosed methods should be considered in a description point of view not a limitation point of view. The scope of the disclosure is shown in the claims, not in the above description, and all differences within the scope will be construed as being included in the disclosure, with functional equivalents of the claims to be included therein.

What is claimed is:

1. A display device comprising:
   a pixel comprising an emission area and a non-emission area;
   a transistor of the pixel;
   a protective layer on the transistor, and comprising an opening area overlapping the non-emission area;
   alignment electrodes on the protective layer and spaced apart from each other;
   light emitting elements between respective ones of the alignment electrodes in the emission area; and
   a connection electrode electrically connected to the light emitting elements, and electrically connected to the transistor in the opening area,
   wherein the connection electrode contacts the transistor through a contact hole in the opening area, and
   wherein the contact hole is formed in one or more of the alignment electrodes so as to pass through the one or more of the alignment electrodes.

2. The display device according to claim 1, wherein the transistor comprises a source electrode or a drain electrode, and
   wherein the connection electrode is electrically connected to the source electrode or the drain electrode.

3. The display device according to claim 2, wherein the connection electrode contacts the source electrode or the drain electrode through the contact hole in the opening area.

4. The display device according to claim 3, further comprising an insulating layer between the alignment electrodes and the connection electrode,
   wherein the contact hole passes through the insulating layer.

5. The display device according to claim 2, further comprising a pad in the opening area.

6. The display device according to claim 5, wherein the pad comprises a pad line, and a pad electrode on the pad line.

7. The display device according to claim 6, wherein the pad line is at a same layer as the source electrode or the drain electrode.

8. The display device according to claim 6, wherein the pad electrode is at a same layer as the connection electrode.

9. The display device according to claim 2, wherein the source electrode or the drain electrode comprises a first electrode layer comprising titanium (Ti), and a second electrode layer on the first electrode layer and comprising copper (Cu).

10. The display device according to claim 9, wherein the source electrode or the drain electrode further comprises a third electrode layer comprising titanium (Ti) on the second electrode layer, and a fourth electrode layer comprising indium tin oxide (ITO) on the third electrode layer.

* * * * *